US011650361B2

(12) United States Patent
Rowlands et al.

(10) Patent No.: US 11,650,361 B2
(45) Date of Patent: May 16, 2023

(54) OPTICAL FILTER

(71) Applicant: VIAVI Solutions Inc., San Jose, CA (US)

(72) Inventors: Scott Rowlands, Santa Rosa, CA (US); Georg J. Ockenfuss, Santa Rosa, CA (US); Tim Gustafson, Santa Rosa, CA (US); Marius Grigonis, Santa Rosa, CA (US)

(73) Assignee: VIAVI Solutions Inc., Chandler, AZ (US)

( * ) Notice: Subject to any disclaimer, the term of this patent is extended or adjusted under 35 U.S.C. 154(b) by 291 days.

(21) Appl. No.: 16/722,325

(22) Filed: Dec. 20, 2019

(65) Prior Publication Data

US 2020/0209448 A1 Jul. 2, 2020

Related U.S. Application Data

(60) Provisional application No. 62/785,487, filed on Dec. 27, 2018.

(51) Int. Cl.
*G02B 5/20* (2006.01)
*G02B 1/115* (2015.01)
(Continued)

(52) U.S. Cl.
CPC .......... *G02B 5/208* (2013.01); *C23C 14/0694* (2013.01); *C23C 14/081* (2013.01);
(Continued)

(58) Field of Classification Search
CPC ........ G02B 5/208; G02B 1/007; G02B 1/115; G02B 5/20; G02B 5/288; G02B 5/281;
(Continued)

(56) References Cited

U.S. PATENT DOCUMENTS 6,590,702 B1 * 7/2003 Shirai ................ G03F 7/091
359/359
7,901,870 B1 * 3/2011 Wach ................ G02B 5/285
430/321

(Continued)

FOREIGN PATENT DOCUMENTS

CN 107209293 A * 9/2017 ............. C23C 16/06
CN 108333661 A * 7/2018 ............. C23C 14/06

(Continued)

OTHER PUBLICATIONS

Partial International Search Report for Application No. PCT/US2019/068362, dated Mar. 30, 2020, 13 pages.

(Continued)

*Primary Examiner* — Mohamed K Amara
(74) *Attorney, Agent, or Firm* — Harrity & Harrity, LLP

(57) ABSTRACT

An optical filter may include a set of optical filter layers disposed onto a substrate. The set of optical filter layers may include a first subset of optical filter layers comprising a first material with a first refractive index. The first material may comprise at least silicon and hydrogen. The set of optical filter layers may include a second subset of optical filter layers comprising a second material with a second refractive index. The second material is different from the first material and the second refractive index is less than the first refractive index. The set of optical filter layers may include a third subset of optical filter layers comprising a third material different from the first material and the second material.

23 Claims, 23 Drawing Sheets

(51) Int. Cl.
  *G02B 1/00* (2006.01)
  *C23C 14/34* (2006.01)
  *C23C 28/00* (2006.01)
  *C23C 14/08* (2006.01)
  *C23C 14/06* (2006.01)
  *C23C 14/10* (2006.01)

(52) U.S. Cl.
  CPC ............ *C23C 14/083* (2013.01); *C23C 14/10* (2013.01); *C23C 14/34* (2013.01); *C23C 28/345* (2013.01); *G02B 1/007* (2013.01); *G02B 1/115* (2013.01); *G02B 5/20* (2013.01)

(58) Field of Classification Search
  CPC . C23C 14/0694; C23C 14/081; C23C 14/083; C23C 14/10; C23C 14/34; C23C 28/345; C23C 28/00; C23C 28/42
  See application file for complete search history.

(56) References Cited

U.S. PATENT DOCUMENTS

| | | | | |
|---|---|---|---|---|
| 9,515,119 | B2* | 12/2016 | Hendrix | H01L 27/14623 |
| 10,168,459 | B2* | 1/2019 | Ockenfuss | C23C 14/352 |
| 10,228,500 | B2* | 3/2019 | Ooi | G02B 5/223 |
| 10,345,489 | B2* | 7/2019 | Fukaya | C03C 17/3452 |
| 11,022,733 | B2* | 6/2021 | Eisenhammer | C23C 14/35 |
| 11,137,521 | B2* | 10/2021 | Fujii | G02F 1/133308 |
| 11,292,288 | B2* | 4/2022 | Aytug | C23C 14/5806 |
| 11,314,004 | B2* | 4/2022 | Chen | G02B 5/281 |
| 2002/0024705 | A1* | 2/2002 | Nakano | G02B 1/16 |
| | | | | 398/159 |
| 2002/0113243 | A1* | 8/2002 | Kikawa | H01S 5/028 |
| | | | | 438/22 |
| 2002/0154387 | A1* | 10/2002 | Mori | G02B 5/288 |
| | | | | 359/337.1 |
| 2003/0039847 | A1* | 2/2003 | Dalakos | C23C 16/24 |
| | | | | 428/448 |
| 2003/0108291 | A1* | 6/2003 | Duveneck | G01N 21/648 |
| | | | | 422/82.11 |
| 2004/0047382 | A1* | 3/2004 | Shigihara | H01S 5/028 |
| | | | | 372/43.01 |
| 2004/0052489 | A1* | 3/2004 | Duveneck | G01N 21/774 |
| | | | | 385/130 |
| 2005/0019484 | A1* | 1/2005 | Arfsten | C03C 17/27 |
| | | | | 427/163.1 |
| 2006/0160031 | A1* | 7/2006 | Wurm | G21K 1/10 |
| | | | | 430/394 |
| 2007/0159697 | A1* | 7/2007 | Terayama | G02B 27/0012 |
| | | | | 359/586 |
| 2013/0271836 | A1* | 10/2013 | Fukaya | G02B 1/14 |
| | | | | 359/507 |
| 2014/0014838 | A1* | 1/2014 | Hendrix | G02B 1/115 |
| | | | | 359/359 |
| 2014/0210031 | A1 | 7/2014 | Hendrix et al. | |
| 2015/0124234 | A1* | 5/2015 | Lafarre | H01L 21/6875 |
| | | | | 355/72 |
| 2015/0132554 | A1* | 5/2015 | Yamaguchi | G02B 1/115 |
| | | | | 428/212 |
| 2016/0172416 | A1* | 6/2016 | Hendrix | G02B 5/288 |
| | | | | 438/59 |
| 2016/0216419 | A1* | 7/2016 | Sprague | C23C 14/165 |
| 2016/0238759 | A1 | 8/2016 | Sprague et al. | |
| 2017/0090071 | A1* | 3/2017 | Fukaya | G02B 1/115 |
| 2017/0336544 | A1 | 11/2017 | Hendrix et al. | |
| 2018/0149781 | A1 | 5/2018 | Ockenfuss | |
| 2019/0109161 | A1* | 4/2019 | Goto | H01L 27/14685 |
| 2019/0212484 | A1* | 7/2019 | Sprague | C23C 14/06 |
| 2020/0408976 | A1* | 12/2020 | Kim | G02B 5/285 |
| 2021/0255377 | A1* | 8/2021 | Liu | C23C 14/3464 |
| 2021/0333454 | A1* | 10/2021 | Ockenfuss | G02B 5/208 |
| 2022/0120950 | A1* | 4/2022 | Chen | G02B 1/115 |
| 2022/0298622 | A1* | 9/2022 | Oliver | C23C 28/42 |

FOREIGN PATENT DOCUMENTS

| | | |
|---|---|---|
| DE | 202017100512 U1 | 2/2017 |
| EP | 3588152 A2 | 1/2020 |
| ES | 2691620 T3 * | 11/2018 ............ C23C 14/08 |
| WO | 2015155356 A1 | 10/2015 |

OTHER PUBLICATIONS

International Search Report and Written Opinion for Application No. PCT/US2019/068362, dated Jul. 10, 2020, 17 pages.

* cited by examiner

| substrate / wafer dimension | | deflection | |
|---|---|---|---|
| size [mm] | thickness [mm] | Si:H design [mm] | SiGe:H design [mm] |
| 200 | 0.7 | 3.29 | 2.07 |
| 200 | 0.5 | 4.05 | 2.54 |
| 200 | 0.2 | 25 | 15.85 |
| 200 | 0.15 | 45 | 28.18 |
| 300 | 0.7 | 4.65 | 2.91 |
| 300 | 0.5 | 9.11 | 5.7 |

FIG. 6C

OPTICAL FILTER

RELATED APPLICATION

This application claims the benefit of U.S. Provisional Patent Application No. 62/785,487, entitled "OPTICAL FILTER," filed on Dec. 27, 2018, the content of which is incorporated by reference herein in its entirety.

BACKGROUND

An optical transmitter may emit light that is directed toward one or more objects. For example, in a gesture recognition system, the optical transmitter may transmit near infrared (NIR) light toward a user, and the NIR light may be reflected off the user toward an optical receiver. In this case, the optical receiver may capture information regarding the NIR light, and the information may be used to identify a gesture being performed by the user. For example, a device may use the information to generate a three dimensional representation of the user, and to identify the gesture being performed by the user based on the three-dimensional representation.

During transmission of the NIR light toward the user and/or during reflection from the user toward the optical receiver, ambient light may interfere with the NIR light. Thus, the optical receiver may be optically coupled to an optical filter, such as a bandpass filter, to filter ambient light and to allow NIR light to pass through toward the optical receiver.

SUMMARY

According to some implementations, an optical filter may include a set of optical filter layers, the set of optical filter layers including: a first subset of optical filter layers comprising a first material with a first refractive index, the first material comprising at least silicon and hydrogen; a second subset of optical filter layers comprising a second material with a second refractive index, the second material being different from the first material and the second refractive index being less than the first refractive index; and a third subset of optical filter layers comprising a third material different from the first material and the second material.

According to some implementations, an optical filter may include: a substrate; one or more high refractive index material layers and one or more low refractive index material layers disposed onto the substrate to filter incident light, wherein a first portion of the incident light with a first spectral range is to be reflected by the optical filter and a second portion of the incident light with a second spectral range is to be passed through by the optical filter, the one or more high refractive index material layers being a first material, and the one or more low refractive index material layers being a second material; and one or more transitional material layers disposed onto the substrate, the one or more transitional material layers being a third material that is different from the first material and the second material.

According to some implementations, an optical system may include: an optical transmitter to emit near-infrared (NIR) light; an optical filter to filter an input optical signal and provide a filtered input optical signal, the input optical signal including the NIR light from the optical transmitter and ambient light from an optical source, the optical filter including a set of dielectric thin film layers, the set of dielectric thin film layers including: a first subset of layers formed from a first material having a first refractive index, a second subset of layers formed from a second material having a second refractive index less than the first refractive index, a third subset of layers formed from a third material different from the first material and the second material, and a fourth subset of layers formed from a fourth material different from the first material, the second material, and the third material; the filtered input optical signal including a reduced intensity of ambient light relative to the input optical signal; and an optical receiver to receive the filtered input optical signal and provide an output electrical signal.

According to some implementations, a method of making an optical filter may include: depositing a first subset of optical filter layers of the optical filter, the first subset of optical filter layers comprising a first material with a first refractive index; depositing a second subset of optical filter layers of the optical filter, the second subset of optical filter layers comprising a second material with a second refractive index that is less than the first refractive index; and depositing a third subset of optical filter layers comprising a third material different from the first material and the second material.

BRIEF DESCRIPTION OF THE DRAWINGS

FIG. 6C is a diagram of one or more examples of mechanical characteristics for a set of materials related to one or more example implementations described herein.

DETAILED DESCRIPTION

Figure 1A:
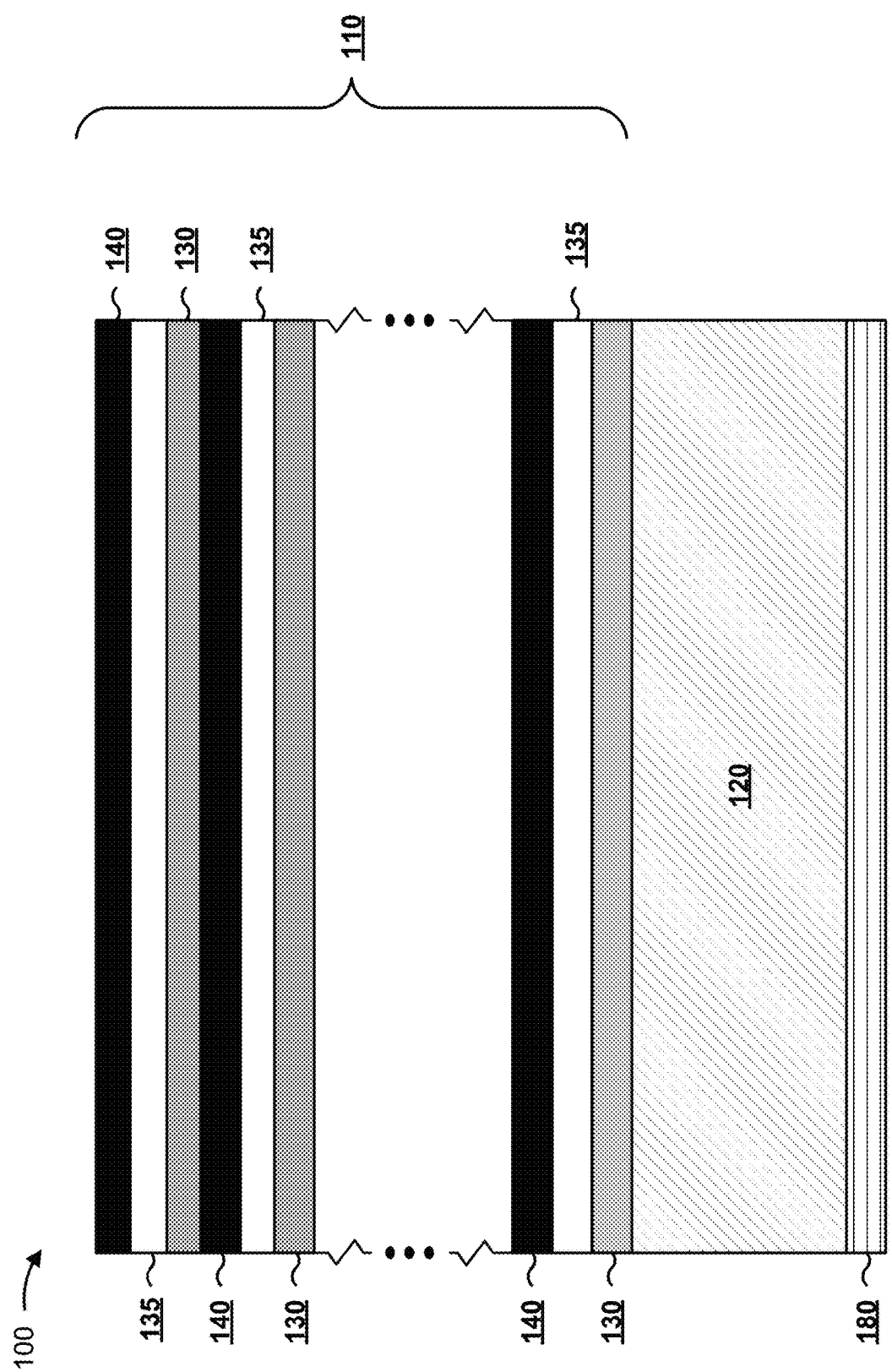
FIGS. 1A-1C are diagrams of one or more example implementations described herein.

The following detailed description of example implementations refers to the accompanying drawings. The same reference numbers in different drawings may identify the same or similar elements. U.S. Patent Application Publication No. 20170336544 to Hendrix et al., published on Nov. 23, 2017, is incorporated herein by reference.

An optical receiver may receive light from an optical source, such as an optical transmitter. For example, the optical receiver may receive near infrared (NIR) light from the optical transmitter and reflected off a target. The targets may include people (e.g., users and non-users), animals, inanimate objects (e.g., cars, trees, obstacles, furniture, walls), and/or the like. In this case, the optical receiver may receive the NIR light as well as ambient light, such as visible spectrum light. The ambient light may include light from one or more light sources separate from the optical transmitter, such as sunlight, light from a light bulb, and/or the like. The ambient light may reduce an accuracy of a determination relating to the NIR light. For example, in a gesture recognition system, the ambient light may reduce an accuracy of generation of a three-dimensional image of the target based on the NIR light. In some examples, the information regarding the NIR light may be used to recognize an identity of the user, a characteristic of the user (e.g., a height or a weight), a state of the user (e.g., the position of the user's eyelids, whether the user is awake, and/or the like), a characteristic of another type of target (e.g., a distance to an object, a size of the object, or a shape of the object), and/or the like. Thus, the optical receiver may be optically coupled to an optical filter, such as a bandpass filter, to filter ambient light and to pass through NIR light toward the optical receiver.

For example, the optical filter may include a set of dielectric thin film layers, which may be selected and deposited to block a portion of out-of-band light below a particular threshold, such as 700 nanometers (nm), and to pass light for a particular range of wavelengths, such as a range of approximately 700 nm to approximately 1700 nm, a range of approximately 800 nm to approximately 1100 nm, a range of approximately 900 nm to approximately 1000 nm, a range of approximately 920 nm to approximately 980 nm, and/or the like. In some examples, the passband may have a center wavelength in a range of 800 nm to 1100 nm, in a range of approximately 820 nm to approximately 880 nm, a range of approximately 920 nm to 980 nm, a range of approximately 870 nm to 930 nm, and/or the like. In another example, the set of dielectric thin film layers may be selected to filter out the ambient light. Additionally, or alternatively, the set of dielectric film layers may be selected to block out-of-band light below the particular threshold, and to pass light for another range of wavelengths, such as a range of approximately 1500 nm to approximately 1600 nm, a range of approximately 1520 nm to approximately 1580 nm, or with a center wavelength at approximately 1550 nm.

Some implementations described herein may utilize a material comprising silicon and hydrogen, a hydrogenated silicon (Si:H) based material, a silicon-germanium (SiGe) based material, a hydrogenated silicon-germanium (SiGe:H) material, and/or the like in a set of high refractive index layers for an optical filter, such as a low angle shift optical filter. The materials in the set of high refractive index layers may include at least silicon (Si) and hydrogen (H), silicon and any isotope of H (e.g., protium (A=1), deuterium (A=2), tritium (A=3)), and/or any mixture thereof. In this way, based on the optical filter having a set of high refractive index layers with a higher effective refractive index relative to another filter stack that uses another high refractive index layer material, the optical filter may provide a relatively low angle shift. Moreover, a filter using any of these high refractive index layer materials may substantially block or effectively screen out ambient light and pass through NIR light.

Figure 1B:
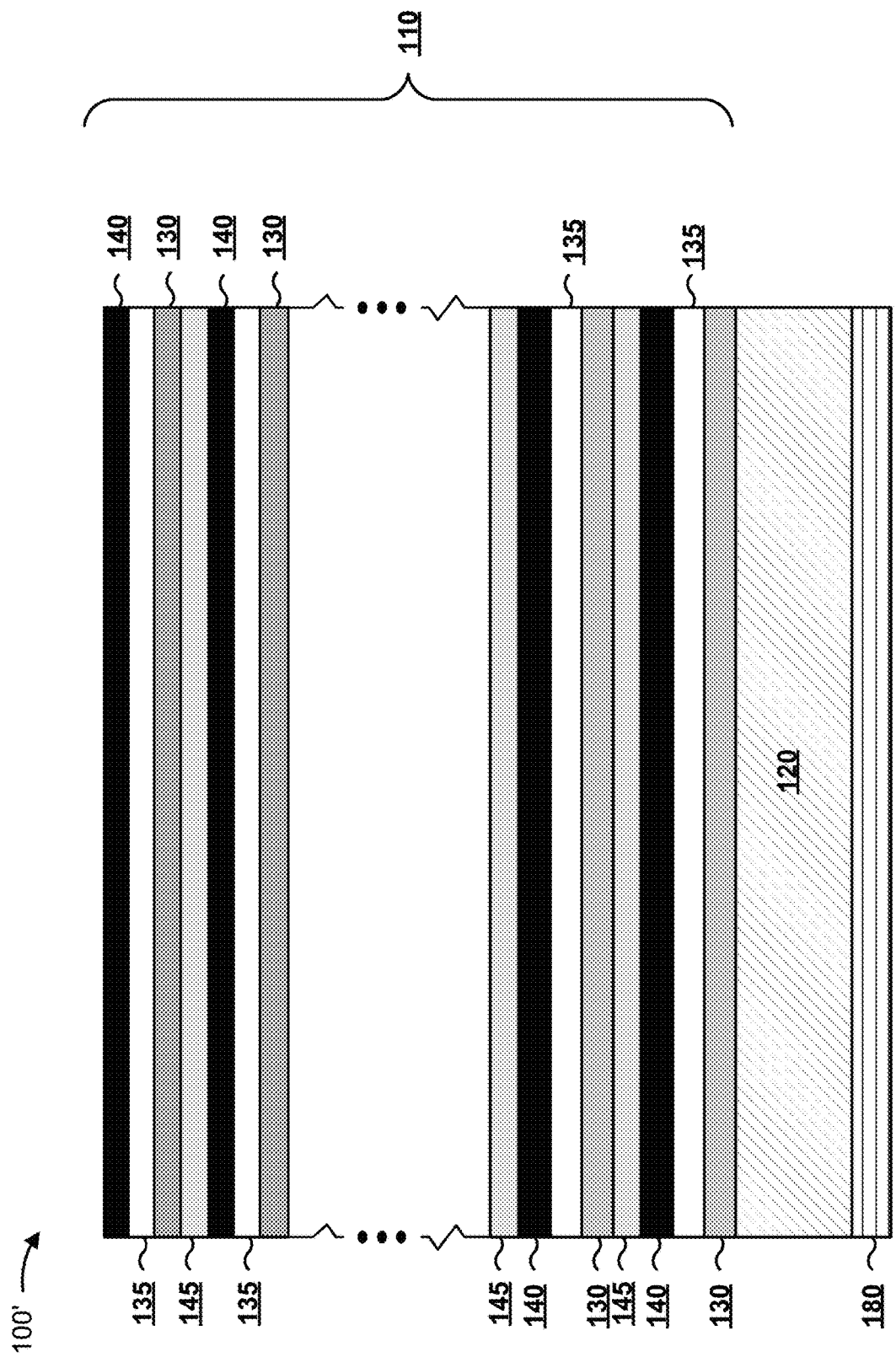
Figure 1C:
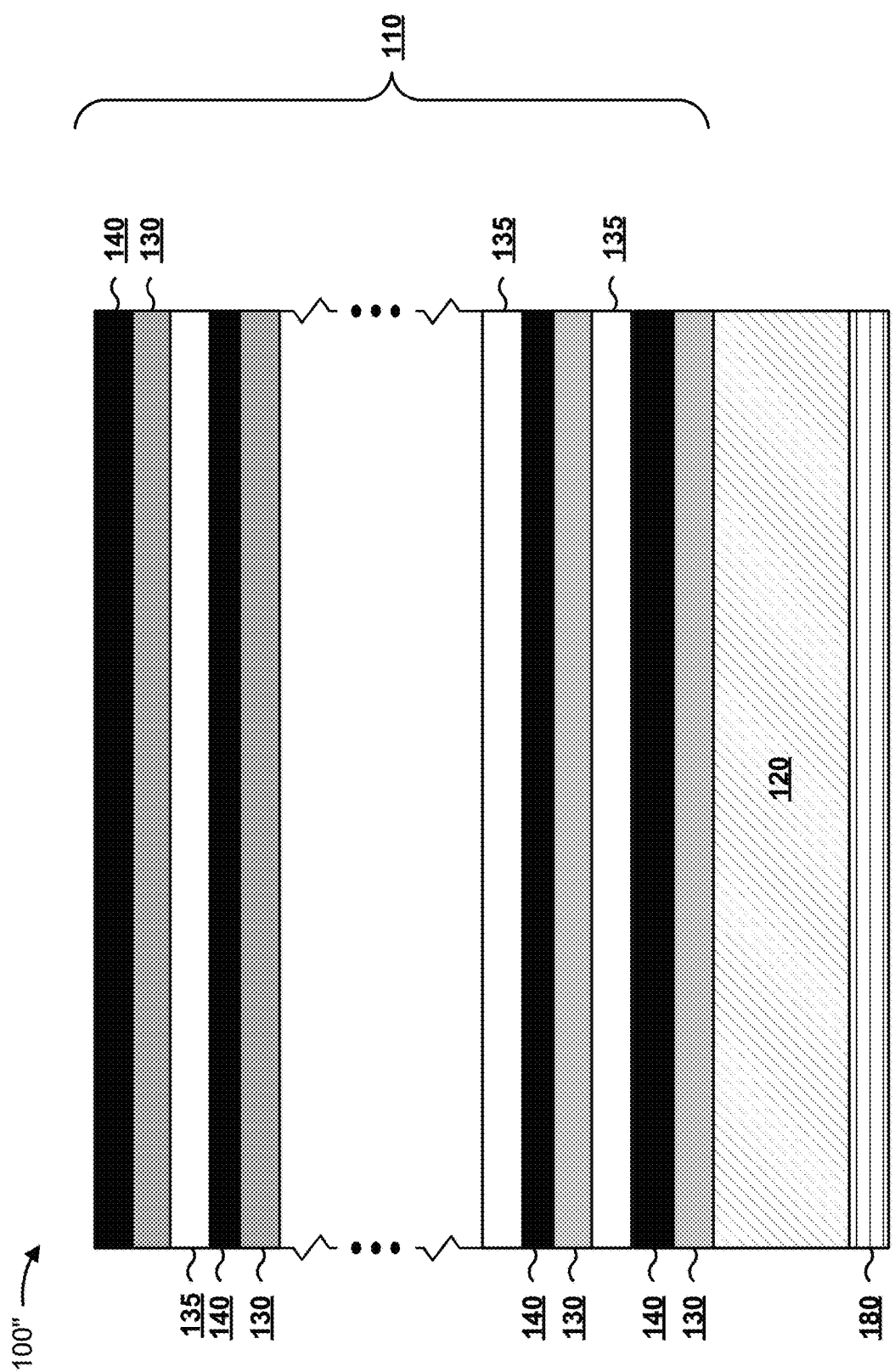

FIGS. 1A-1C are diagrams of example optical filters 100, 100', 100". FIGS. 1A-1C show example stackups of an optical filter using three or more different materials. As further shown in FIGS. 1A-1C, optical filters 100, 100', 100" may include an optical filter coating portion 110 and a substrate 120.

As shown in FIGS. 1A-1C, optical filter coating portion 110 includes a set of optical filter layers. For example, optical filter coating portion 110 includes a first set of layers 130, a second set of layers 140, and a third set of layers 135. The first set of layers 130 may include a set of layers of a high refractive index material, and may be referred to herein as H layers 130. For example, in some implementations, the H layers 130 may include materials comprising hydrogen and silicon (e.g., hydrogenated silicon (Si:H) layers that may include silicon (Si) and hydrogen (H), Si and any isotope of H, including protium (A=1), deuterium (A=2), and/or tritium (A=3), hydrogenated silicon-germanium (SiGe:H) layers, and/or the like). In some implementations, the H layers 130 may include materials comprising silicon and germanium (e.g., silicon-germanium (SiGe) layers and/or the like).

These high refractive index materials may have a refractive index higher than 3, 3.2, 3.5, 3.6, 4, and/or the like over a range of at least 800 nanometers (nm) to 1100 nm. For example, Si:H may have a refractive index of greater than 3 over the wavelength range of 800 nm to 1100 nm. In some implementations, the Si:H material has a refractive index of greater than 3.5 over the wavelength range of 800 nm to 1100 nm, (e.g., a refractive index of greater than 3.64). In some implementations, the Si:H material may have a refractive index of approximately 3.8 at a wavelength of approximately 830 nm. In some implementations, the refractive index may be greater than 3.87 at 800 nm. In some implementations, the Si:H material has a refractive index of less than 4.3 over the wavelength range of 800 nm to 1100 nm. The high refractive index layers may include phosphorous, boron, nitride, argon, oxygen, carbide, and/or the like.

In some implementations, the second set of layers 140 may include a set of layers of a low refractive index material, and may be referred to herein as L layers 140. For example, the refractive index of the L layers 140 is generally lower than the refractive index of the H layers 130. In some implementations, the L layers 140 may include silicon, magnesium, fluoride, oxygen, tantalum, nitride, niobium, titanium, aluminum, zirconium, yttrium, or a combination thereof. For example, the L layers 140 may include silicon dioxide ($SiO_2$) layers, silicon nitride ($Si_3N_4$) layers, magnesium fluoride ($MgF_2$) layers, tantalum pentoxide ($Ta_2O_5$) layers, niobium pentoxide ($Nb_2O_5$) layers, titanium dioxide ($TiO_2$) layers, aluminum oxide ($Al_2O_3$) layers, zirconium oxide ($ZrO_2$) layers, yttrium oxide ($Y_2O_3$) layers, a combination thereof, and/or the like.

In some implementations, the third set of layers 135 may correspond to transitional layers, and may be referred to herein as O layers 135. In some implementations, the O layers 135 may include a third material different from the H layers 130 and/or the L layers 140. The O layers 135 may be any material, including an oxide. For example, the O layers may include silicon, silicon oxide (of any concentration) (e.g., $SiO_x$, where $0<x<2$), silicon dioxide ($SiO_2$), a combination thereof, and/or the like.

As shown in FIG. 1B, the optical filter coating portion 110 may include a fourth set of layers 145, which may correspond to a second set of transitional layers referred to herein as P layers 145. In some implementations, the P layers 145 may include a fourth material that is different from the H layers 130, the O layers 135, and the L layers 140. Alternatively, in some implementations, the P layers 145 may be the same material or a similar material as the O layers 135. The P layers may be any material, including an oxide. For example, the P layers 145 may include silicon, silicon oxide (of any concentration) (e.g., $SiO_x$, where $0<x<2$), silicon dioxide ($SiO_2$), a combination thereof, and/or the like. In some implementations, FIG. 1A illustrates repeating units of layers H-O-L, where an O layer 135 is before every H layer 130 (when counting from an air interface toward the substrate 120). In contrast, FIG. 1B illustrates repeating units of layers H-O-L with P layers 145 disposed between each H-O-L unit. In further contrast, FIG. 1C illustrates repeating units of layers H-L with O layers disposed between each H-L unit.

In some implementations, the outmost layer (e.g., a layer closest to the air interface) may be a layer other than an L layer 140. For example, in some implementations, the outmost layer may be an H layer 130, an O layer 135, or a P layer 145. In some implementations, a functional layer and/or coating may be external to optical filter coating portion 110. For example, in some implementations, the functional layer and/or coating may include an anti-smudge coating, a protective coating, a durable coating, an anti-fog coating, a hydrophilic coating, and/or a hydrophobic coating. In one example, the outmost layer may be a nitride.

In some implementations, layers 130, 135, 140, and 145 may be stacked in a particular order, such as an $(H-O-L)_m$ order, an $(H-O-L-O)_m$ order, an $(H-L-O)_m$ order, an $(H-O-L-P)_m$ order, an $(H-O-L)_m$-H order, an $(H-O-L-P)_m$-H order, an $(H-O-L-P)_m$-H-O-L order, an $L-(H-O-L)_m$ order, an $L-P-(H-O-L-P)_m$ order, a combination thereof, another possible order, and/or the like, where m is a quantity of units of layers and has a value greater than or equal to one. For example, as shown in FIG. 1A, layers 130, 135, and 140 are positioned in an $(H-O-L)_m$ order with an L layer 140 disposed at a surface of optical filter 100 and an H layer 130 disposed at a surface of substrate 120. Furthermore, in the example shown in FIG. 1B, layers 130, 135, 140, and 145 are positioned in an $(H-O-L-P)_m$ order with an L layer 140 disposed at a surface of optical filter 100' and an H layer 130 disposed at a surface of substrate 120. In the example shown in FIG. 1C, layers 130, 135, and 140 are positioned in an $(H-L-O)_m$ order with an L layer 140 disposed at a surface of optical filter 100" and an H layer 130 disposed at a surface of substrate 120.

The quantity, thickness, and/or order of the layers may affect optical quality of optical filter coating portion 110 and/or optical filter 100, 100', 100", including the optical transmission and angle shift. In some implementations, optical filter coating portion 110 may be associated with a particular quantity of layers, m. For example, optical filter coating portion 110 may include 2 to 200 layers, 10 to 100 layers, or 30 to 60 layers. Optical filter coating portion 110 may include 10 to 40 H layers 130. In some examples, a SiGe:H based optical filter may include a range of 2 layers to 200 layers.

In some implementations, each layer of optical filter coating portion 110 may be associated with a particular thickness. For example, layers 130 and 140 may each be associated with a thickness of between 1 nm and 1500 nm, 3 nm and 1000 nm, 6 nm and 1000 nm, or 10 nm and 500 nm, and/or optical filter coating portion 110 may be associated with a thickness of between 0.1 µm and 100 µm, 0.25 µm and 20 µm, and/or the like. In some examples, at least one of layers 130 and 140 may be associated with a thickness of less than 1000 nm, less than 600 nm, less than 100 nm, or less than 20 nm, and/or optical filter coating portion 110 may be associated with a thickness of less than 100 µm, less than 50 µm, and/or less than 10 µm. In some implementations, layers 130 and 140 may be associated with multiple thicknesses, such as a first thickness for layers 130 and a second thickness for layers 140, a first thickness for a first subset of layers 130 and a second thickness for a second subset of layers 130, a first thickness for a first subset of layers 140 and a second thickness for a second subset of layers 140, and/or the like. In this case, a layer thickness and/or a quantity of layers may be selected based on an intended set of optical characteristics, such as an intended passband, an intended reflectance, and/or the like.

Layers 135 and 145 may each be associated with a thickness of between 1 nm and 20 nm. Depending on the manufacturing method and/or the desired optical qualities of the optical filter coating portion 110 and/or optical filter 100, 100', 100", O layers 135 and P layers 145 may each be associated with a thickness of less than 10 nm. In some examples, O layers 135 and P layers 145 may each be associated with a thickness of 1 nm to 10 nm or 2 nm to 6 nm, or approximately 5 nm. In some implementations, O layers 135 and P layers 145 may each be associated with a thickness of between 2 nm and 6 nm, or approximately 5 nm. In some implementations, O layers 135 and P layers 145 may be associated with multiple thicknesses, such as a first thickness for O layers 135 and a second thickness for P layers 145, a first thickness for a first subset of O layers 135 and a second thickness for a second subset of O layers 135, a first thickness for a first subset of P layers 145 and a second thickness for a second subset of P layers 145, and/or the like. In this case, a layer thickness and/or a quantity of layers may be selected based on an intended set of optical characteristics, such as an intended passband, an intended reflectance, and/or the like.

In some implementations, a particular SiGe based material may be selected for the H layers 130. For example, in some implementations, H layers 130 may be selected and/or manufactured (e.g., via a sputtering procedure, as described in further detail below) to include a particular type of SiGe, such as SiGe-50, SiGe-40, SiGe-60, and/or the like.

In some implementations, H layers 130 may include another material, such as argon, as a result of a sputter deposition procedure, as described herein. In another example, the H layers 130 may be manufactured using a hydrogenating procedure to hydrogenate a silicon or SiGe based material, a nitrogenating procedure to nitrogenate the silicon or SiGe based material, one or more annealing procedures to anneal the silicon or SiGe based material, another type of procedure, a doping procedure (e.g., phosphorous based doping, nitrogen based doping, boron based doping, and/or the like) to dope the silicon or SiGe based material, or a combination of multiple procedures (e.g., a combination of hydrogenation, nitrogenation, annealing, and/or doping), as described herein. For example, H layers 130 may be selected to include a refractive index greater than that of L layers 140 over, for example, a spectral range of approximately 800 nm to approximately 1100 nm, a spectral range of approximately 820 nm to approximately 1000 nm, a particular wavelength of approximately 950 nm, and/or the like. In another example, H layers 130 may be selected to include a refractive index greater than that of L layers 140 over, for example, a spectral range of approximately 1400 nm to approximately 1700 nm, a spectral range of approximately 1500 nm to approximately 1600 nm, a particular wavelength of approximately 1550 nm, and/or the like. In this case, H layers 130 may be associated with a refractive index greater than 3, a refractive index greater than 3.5, a refractive index greater than 3.8, or a refractive index greater than 4. For example, H layers 130 may be associated with a refractive index greater than 4 at approximately 950 nm where H layers 130 include SiGe:H, about 3.74 at approximately 950 nm where H layers include Si:H, and/or the like.

In some implementations, a particular material may be selected for L layers 140. For example, L layers 140 may include a set of $SiO_2$ layers, a set of $Al_2O_3$ layers, a set of $TiO_2$ layers, a set of $Nb_2O_5$ layers, a set of $Ta_2O_5$ layers, a set of $MgF_2$ layers, a set of $Si_3N_4$ layers, a set of $ZrO_2$ layers, a set of $Y_2O_3$ layers, and/or the like. In this case, L layers 140 may be selected to include a refractive index lower than that of the H layers 130.

In some implementations, H layers 130 and/or L layers 140 may be associated with a particular extinction coefficient. For example, for H layers 130 including silicon and hydrogen, the extinction coefficient may be below approximately 0.001 over a particular spectral range. For example, the extinction coefficient may be below approximately 0.001 over a spectral range of approximately 800 nm to approximately 1100 nm, a spectral range of approximately 900 nm to approximately 1000 nm, a wavelength of approximately 954 nm, and/or the like. For H layers 130 including germanium, such an extinction coefficient may be below approximately 0.007 (0.004 for Si:H at 800 nm), an extinction coefficient of below approximately 0.003 (0.002 for Si:H at 800 nm), an extinction coefficient of below approximately 0.001, and/or the like over a particular spectral range. For example, the extinction coefficient may be defined over a spectral range of approximately 800 nm to approximately 1100 nm, a spectral range of approximately 900 nm to approximately 1000 nm, a wavelength of approximately 954 nm, and/or the like. Additionally, or alternatively, the extinction coefficient may be defined over a spectral range of approximately 1400 nm to approximately 1700 nm, a spectral range of approximately 1500 nm to approximately 1600 nm, a particular wavelength of approximately 1550 nm, and/or the like. In some implementations, the particular material used for L layers 140 may be selected based on a desired width of an out-of-band blocking spectral range, a desired center-wavelength shift associated with a change of angle of incidence (AOI), and/or the like.

In some implementations, optical filter 100, 100', 100" may include a coating 180 on the opposite side of the substrate from optical filter coating portion 110. Coating 180 may be a single layer or multiple layers. In some examples, coating 180 may be an anti-reflective coating, a blocking filter, and/or bandpass filter. Coating 180 may include at least one of an oxide, including $SiO_x$, $SiO_2$, $TiO_2$, $Ta_2O_5$, and/or the like. In one example, coating 180 may be alternating layers of $SiO_2$ and $TiO_2$. Additionally, or alternatively, coating 180 may have a similar structure as optical filter coating portion 110, and may include more than two materials. In some implementations, coating 180 may include the H layers 130, L layers 140, O layers 135, and/or P layers 145 of optical filter coating portion 110.

Optical filter coating portion 110 may be fabricated by any method, including but not limited to any coating and/or sputtering process. For example, the optical filter coating portion 110 as shown in FIG. 1A may be fabricated by depositing an H layer 130 on substrate 120 and then depositing an O layer 135 on the H layer 130. An L layer 140 may then be deposited on the O layer 135, and a second H layer 130 may then be deposited on the L layer 140. This may be repeated until the desired quantity of layers is deposited. The optical filter coating portion 110 as shown in FIG. 1B may be fabricated by depositing an H layer 130 on substrate 120 and then depositing an O layer 135 on the H layer 130. An L layer 140 may then be deposited on the O layer 135, and a P layer 145 may be deposited on the L layer 140. A second H layer 130 may then be deposited on P layer 145. This may be repeated until the desired quantity of layers is deposited. Similarly, the optical filter coating portion 110 as shown in FIG. 1C may be fabricated by depositing an H layer 130 on substrate 120 and then depositing an L layer 140 on the H layer 130. An O layer 135 may then be deposited on the L layer 140, and a second H layer 130 may then be deposited on the O layer 135. This may be repeated until the desired quantity of layers is deposited. In some cases, there may be other materials in one or more of the layers 130, 135, 140, 145, and/or the like. For example, during deposition processes, materials used to form a deposited layer may bleed into an underlying layer.

In some implementations, although specific materials may be deposited during the fabrication process, the final composition of optical filter coating portion 110 may be different from that which was deposited. For example, a first H layer 130 of Si:H may be deposited on the substrate 120. A first O layer 135 of $SiO_2$ may be deposited on the first H layer 130 of Si:H. A first L layer 140 of $Ta_2O_5$ may be deposited on the first O layer of $SiO_2$. A second H layer 130 of Si:H may be deposited on the first L layer 140 of $Ta_2O_5$. A second O layer 135 of $SiO_2$ may be deposited on the second H layer 130 of Si:H. A second L layer 140 of $Ta_2O_5$ may be deposited on the second O layer 135 of $SiO_2$. Accordingly, the final optical filter coating portion 110 may appear as it was deposited: substrate —Si:H—$SiO_2$—$Ta_2O_5$—Si:H—$SiO_2$—$Ta_2O_5$. In some implementations, however, the O layer 135 may appear as a transition layer (e.g., substrate —Si:H—$SiO_x$—$Ta_2O_5$—Si:H—$SiO_x$—$Ta_2O_5$, where $0<x<2$, such as $SiO_{1.3}$, $SiO_{1.7}$, and/or the like). In some implementations, the O layers 135 may not be the same material (e.g., the first O layer 135 may be $SiO_2$ and the second O layer 135 may be $SiO_{1.3}$). Additionally, or alternatively, one or more of the H layers 130 may include oxygen or an oxygen-based material (e.g., SiOH, SiGeOH, SiGeO, and/or the like). Additionally, or alternatively, the final optical filter coating portion 110 may include a first Si:H layer deposited on a substrate, a first $SiO_2$ layer deposited on the first Si:H layer, a first $Ta_2O_5$ layer deposited on the first $SiO_2$ layer, a second Si:H layer deposited on the first $Ta_2O_5$ layer, a second $SiO_2$ layer deposited on the second Si:H layer, a second $Ta_2O_5$ layer deposited on the second $SiO_2$ layer, and a third $SiO_2$ layer deposited on the second $Ta_2O_5$ layer.

In some implementations, optical filter coating portion 110 may be fabricated using a sputtering procedure. For example, optical filter coating portion 110 may be fabricated using a pulsed-magnetron based sputtering procedure to sputter layers 130, 135, 140, and/or 145 on the substrate 120, which may be a glass substrate or another type of substrate. In some implementations, multiple cathodes may be used for the sputtering procedure, such as a first cathode to sputter silicon and a second cathode to sputter germanium. In this case, the multiple cathodes may be associated with an angle of tilt of the first cathode relative to the second cathode selected to ensure a particular concentration of germanium relative to silicon, as described above. In some implementations, hydrogen flow may be added during the sputtering procedure to hydrogenate the silicon or silicon-germanium. Similarly, nitrogen flow may be added during the sputtering procedure to nitrogenate the silicon or silicon-germanium. In some implementations, optical filter coating portion 110 may be annealed using one or more annealing procedures, such as a first annealing procedure at a temperature of approximately 280 degrees Celsius or between approximately 200 degrees Celsius and approximately 400 degrees Celsius, a second annealing procedure at a temperature of approximately 320 degrees Celsius or between approximately 250 degrees Celsius and approximately 350 degrees Celsius, and/or the like. In some implementations, optical filter coating portion 110 may be fabricated using a SiGe:H coated from a target, as described with regard to FIGS. 1A-1D. For example, a SiGe compound target with a selected ratio of silicon to germanium may be sputtered to fabricate optical filter coating portion 110 with a particular silicon to germanium ratio.

In some implementations, optical filter coating portion 110 may be associated with causing a reduced angle shift relative to an angle shift caused by another type of optical filter. For example, based on a refractive index of the H layers 130 relative to a refractive index of the L layers 140, optical filter coating portion 110 may cause a reduced angle shift relative to another type of optical filter with another type of high refractive index material.

In some implementations, optical filter coating portion 110 is attached to a substrate, such as substrate 120. For example, optical filter coating portion 110 may be attached to a glass substrate or another type of substrate. Additionally, or alternatively, optical filter coating portion 110 may be coated directly onto a detector or onto a set of silicon wafers including an array of detectors (e.g., using photo-lithography, a lift-off process, and/or the like). In some implementations, optical filter coating portion 110 may be associated with an incident medium. For example, optical filter coating portion 110 may be associated with an air medium or a glass medium as an incident medium. In some implementations, optical filter 100, 100', 100" may be disposed between a set of prisms. In another example, another incident medium may be used, such as a transparent epoxy, and/or another substrate may be used, such as a polymer substrate (e.g., a polycarbonate substrate, a cyclic olefin copolymer (COP) substrate, and/or the like).

In some implementations, optical filter 100, 100', 100" may be an interference filter having a transmittance passband with a transmittance level of greater than 90%. For the transmittance passband in relation to the transmittance level, the transmittance passband is defined on a lower wavelength boundary at a lowest wavelength that the transmission is greater than 90% and on a higher wavelength boundary at a highest wavelength that the transmission is lower than 90%. In some examples, the transmission passband may have an average transmission greater than 90%, greater than 94%, or greater than 95%. For example, average transmittance in a passband may be greater 94% and peak transmittance in the passband may be greater than 97%, which may depend on wavelength range (e.g., the above-mentioned values may apply for wavelengths greater than about 840 nm, and the above-mentioned values may be about 2% lower at shorter wavelengths, and SiGe:H may also have a lower transmittance).

In some implementations, optical filter 100, 100', 100" may provide blocking outside of the passband (e.g., a stopband on one or both sides of the passband) over a wavelength range of 400 nm to 1100 nm, or over a wavelength range of 300 nm to 1100 nm. In some implementations, optical filter 100, 100', 100" may have a blocking level within a stopband of greater than optical density 2 (OD2) over the wavelength range of 400 nm to 1100 nm, a blocking level within the stopband of greater than optical density 3 (OD3) over the wavelength range of 300 nm to 1100 nm, or a blocking level of greater than optical density 4 (OD4) over the wavelength range of 300 nm to 1100 nm. In some examples, optical filter 100, 100', 100" may provide a blocking level of greater than OD2 from 400 nm to 800 nm or greater than OD3 from 400 nm to 800 nm. For the stopband in relation to the blocking level, the stopband at wavelengths below the passband is defined with a high wavelength boundary by the highest wavelength that the blocking level is greater than specified OD level (e.g., OD2 or OD3) and the stopband at wavelength above the passband is defined by the lowest wavelength that the blocking level is greater than the specified OD level (e.g., OD 2 or OD 3). In some examples, the stopband has an average blocking level of greater than OD2 or OD3. In some examples, optical filter 100, 100', 100" may provide an average blocking level of OD2 from 400 nm to 800 nm or greater than OD 4 or an average blocking level of OD3 from 400 nm to 800 nm.

In some instances, optical filter 100, 100', 100" may be a long-wavelength-pass edge filter, and the passband has an edge wavelength in the wavelength range of 800 nm to 1100 nm. However, in most instances, the optical filter 100, 100', 100" is a bandpass filter, such as a narrow bandpass filter. Typically, the passband has a center wavelength in a wavelength range of 800 nm to 1100 nm. The passband has a full width at half maximum (FWHM) of less than 60 nm. In some examples, the passband may have a FWHM of less than 55 nm, less than 50 nm, or less than 45 nm. The entire passband may be within the wavelength range of 800 nm to 1100 nm. In some examples, the FWHM may depend on various factors, including the application, light source thermal management, design of optical filter 100, 100', 100", angle range, and/or the like. For example, at 5 nm, a thermally controlled device may operate over a narrow angle range, with the light source and optical filter 100, 100', 100" having a manufacturing tolerance that satisfies a threshold (e.g., less than one nanometer). In another example, at 120 nm, a device may have a light source with a high temperature change of the source wavelength, and may operate over a large temperature range (e.g., from minus 40° to 120° Celsius) for a large acceptance angle. In this case, the light source may have a more flexible manufacturing tolerance (e.g., +/−10 nanometers). In some implementations described herein, the passband may be defined as including wavelengths where a transmission level is greater than 90%, greater than 94%, greater than 95%, and/or the like. However, it will be appreciated that, in other examples, there could be another suitable definition of a passband. Furthermore, in some implementations described herein, the stopband may be defined as including wavelengths where a transmission level is greater than OD2, greater than OD3, greater than OD4, and/or the like. However, it will be appreciated that, in other examples, there could be another suitable definition of a stopband.

In some implementations, optical filter 100, 100', 100" may have a low center-wavelength shift with a change in incidence angle. The CWL of the passband shifts by less than 20 nm in magnitude with a change in incidence angle from 0° to 30°. In some examples, the CWL of the passband may shift less than 15 nm in magnitude with a change in incidence angle from 0° to 30°. The CWL of the passband shifts between 20 nm and 6 nm in magnitude with a change in incidence angle from 0° to 30°. The CWL of the passband shifts by less than 12 nm in magnitude with a change in incidence angle from 0° to 30°. The CWL of the passband shifts between 12 nm and 6 nm in magnitude with a change in incidence angle from 0° to 30°.

As indicated above, FIGS. 1A-1C are provided merely as one or more examples. Other examples may differ from what is described with regard to FIGS. 1A-1C.

FIGS. 2A-2D are diagrams of one or more examples of optical characteristics and/or mechanical characteristics for a set of materials related to one or more example implementations described herein.

Figure 2A:
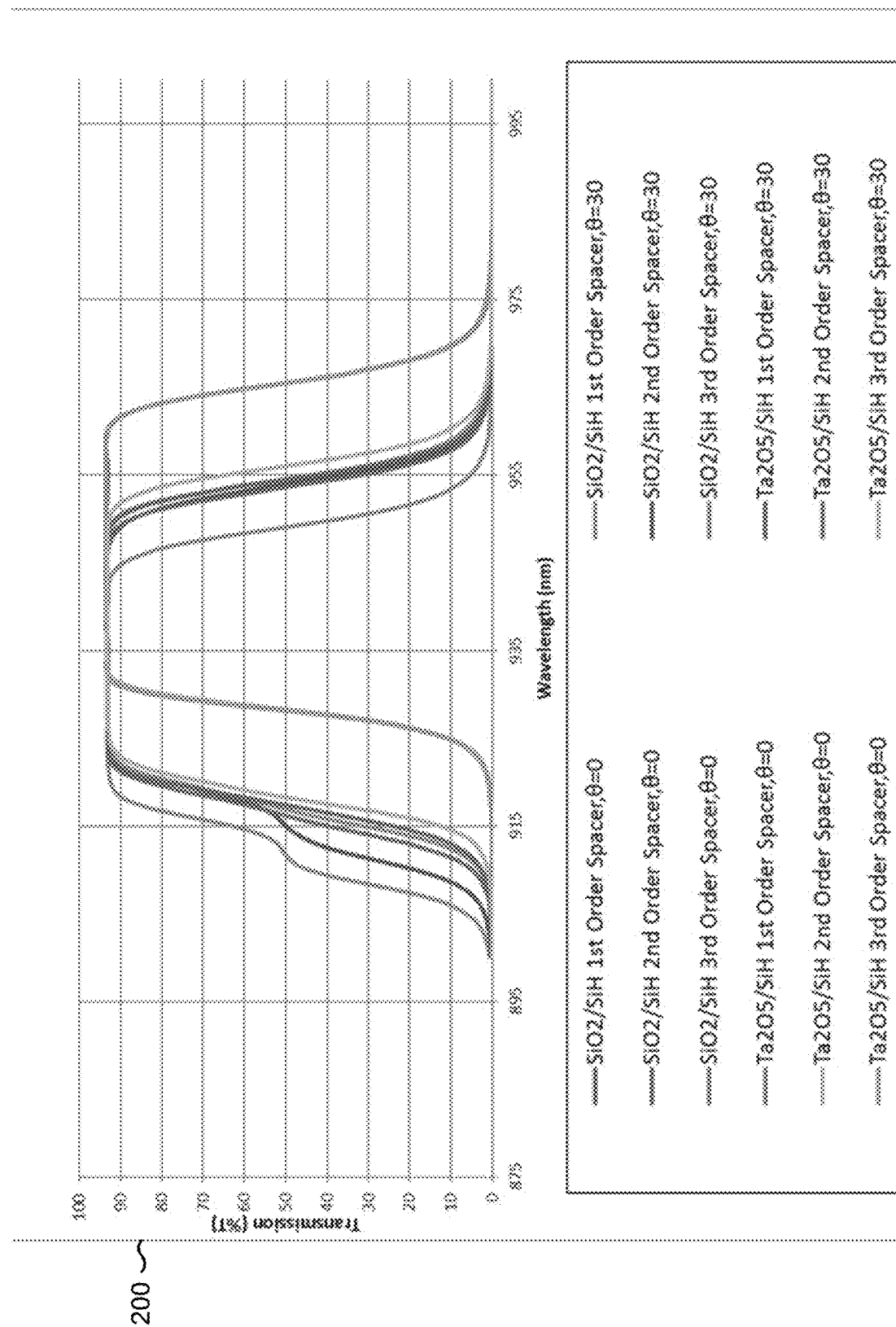
FIGS. 2A-2D are diagrams of one or more examples of optical characteristics and/or mechanical characteristics for a set of materials related to one or more example implementations described herein.

As shown in FIG. 2A, and by chart 200, an optical filter having a configuration as shown in and/or described above with reference to FIGS. 1A-1C may achieve a lower angle shift with a design in which the H layers 130 include Si:H as a high refractive index material and the L layers 140 include $Ta_2O_5$ as a low refractive index material (e.g., with second order spacers) relative to a design in which the H layers 130 include Si:H as the high refractive index material and the L layers 140 include $SiO_2$ as the low refractive index material. For example, FIG. 2A illustrates plots showing a transmission percentage as a function of wavelength for six different designs. In particular, the various plots illustrated in FIG. 2A include three designs in which the L layers 140 include $SiO_2$ as the low refractive index material with first, second, and third order spacer layers that include Si:H and three designs in which the O layers 135 and P layers 145 include an oxide, such as silicon oxide (of any concentration) (e.g., $SiO_x$, where 0<x<2), silicon dioxide ($SiO_2$), and further in which L layers 140 include $Ta_2O_5$ as the low refractive index material with first, second, and third order spacer layers that include Si:H. As shown, all of the designs have substantially similar performance at an AOI of 0 degrees.

Figure 2B:
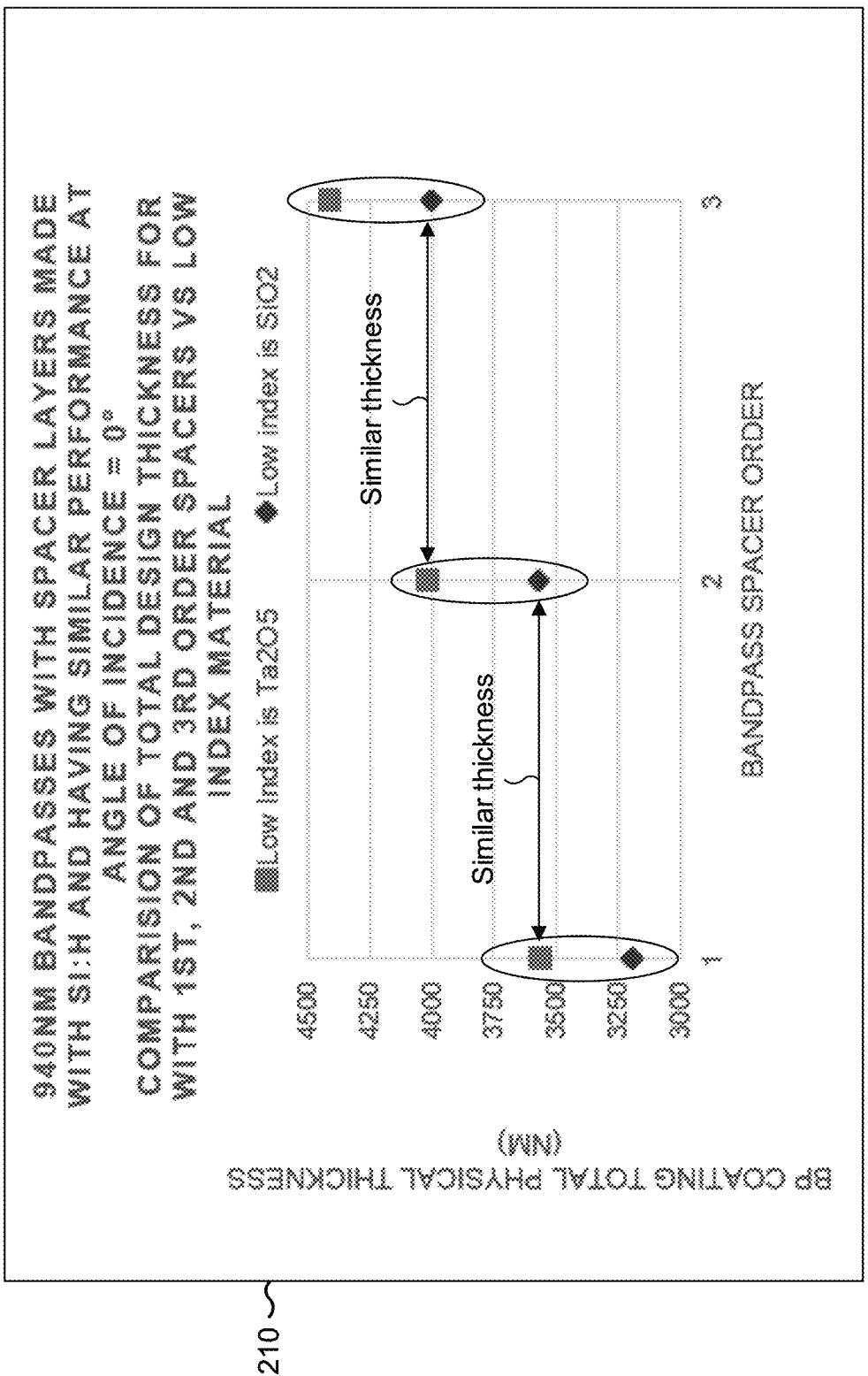

As shown in FIG. 2B, and by chart 210, a thickness (in nanometers) of an optical filter having a configuration as shown in and/or described above with reference to FIGS. 1A-1C may depend on a material that is used for the low refractive index material in the L layers 140. For example, as described above with reference to FIG. 2A, $SiO_2$ and $Ta_2O_5$ have bandpasses that offer substantially similar performance at an AOI of 0 degrees. However, as shown by chart 210, using $Ta_2O_5$ as the low refractive index material in the L layers 140 (or other reflector layers) and/or including transitional layers such as silicon oxide (of any concentration) (e.g., $SiO_x$, where 0<x<2) or silicon dioxide ($SiO_2$) increases overall design thickness relative to designs that use $SiO_2$ as the low refractive index material regardless of a spacer layer order. For example, the design containing $Ta_2O_5$ has a physical thickness of more than 3500 nm and the design containing $SiO_2$ has a physical thickness of less than 3250 nm for a first order spacer layer, the design containing $Ta_2O_5$ has a physical thickness of more than 4000 nm and the design containing $SiO_2$ has a physical thickness of about 3600 nm for a second order spacer layer, and the design containing $Ta_2O_5$ has a physical thickness of almost 4500 nm and the design containing $SiO_2$ has a physical thickness of about 4000 nm for a third order spacer layer. In general, designs containing $Ta_2O_5$ may add to the total design thickness because an index ratio between Si:H and $Ta_2O_5$ is lower than for Si:H and $SiO_2$.

Figure 2C:
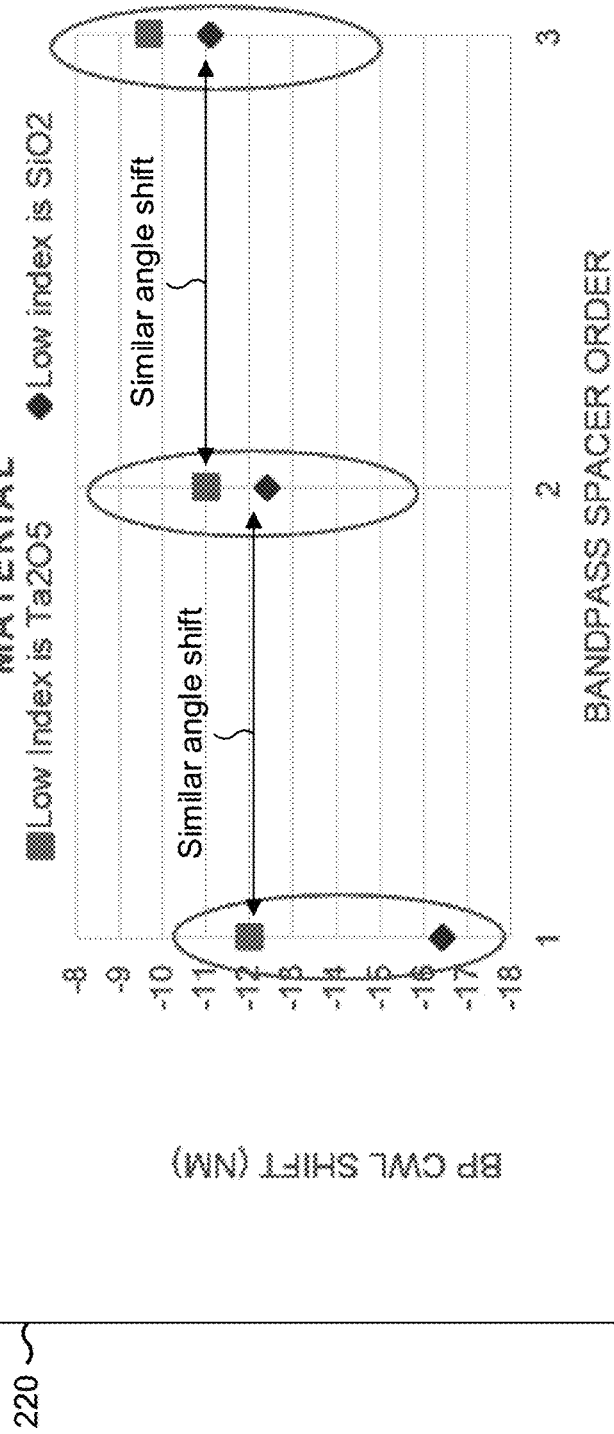

As shown in FIG. 2C, and by chart 220, using $Ta_2O_5$ for the low refractive index material may decrease an undesired downshift in center wavelength (CWL) for an increasing AOI. For example, chart 220 illustrates a comparison in a CWL shift (in nanometers) for designs containing $Ta_2O_5$ and designs containing $SiO_2$ at different bandpass spacer orders. As shown, a CWL downshift is generally less for designs containing $Ta_2O_5$ relative to designs containing $SiO_2$ at any bandpass spacer order because $Ta_2O_5$ has a higher refractive index than $SiO_2$. Accordingly, in an optical filter having a configuration as shown in and/or described above with reference to FIGS. 1A-1C, using a material that has a relatively higher refractive index in the L layers 140 (e.g., $Ta_2O_5$ rather than $SiO_2$) may generally decrease a bandpass angle shift.

Figure 2D:
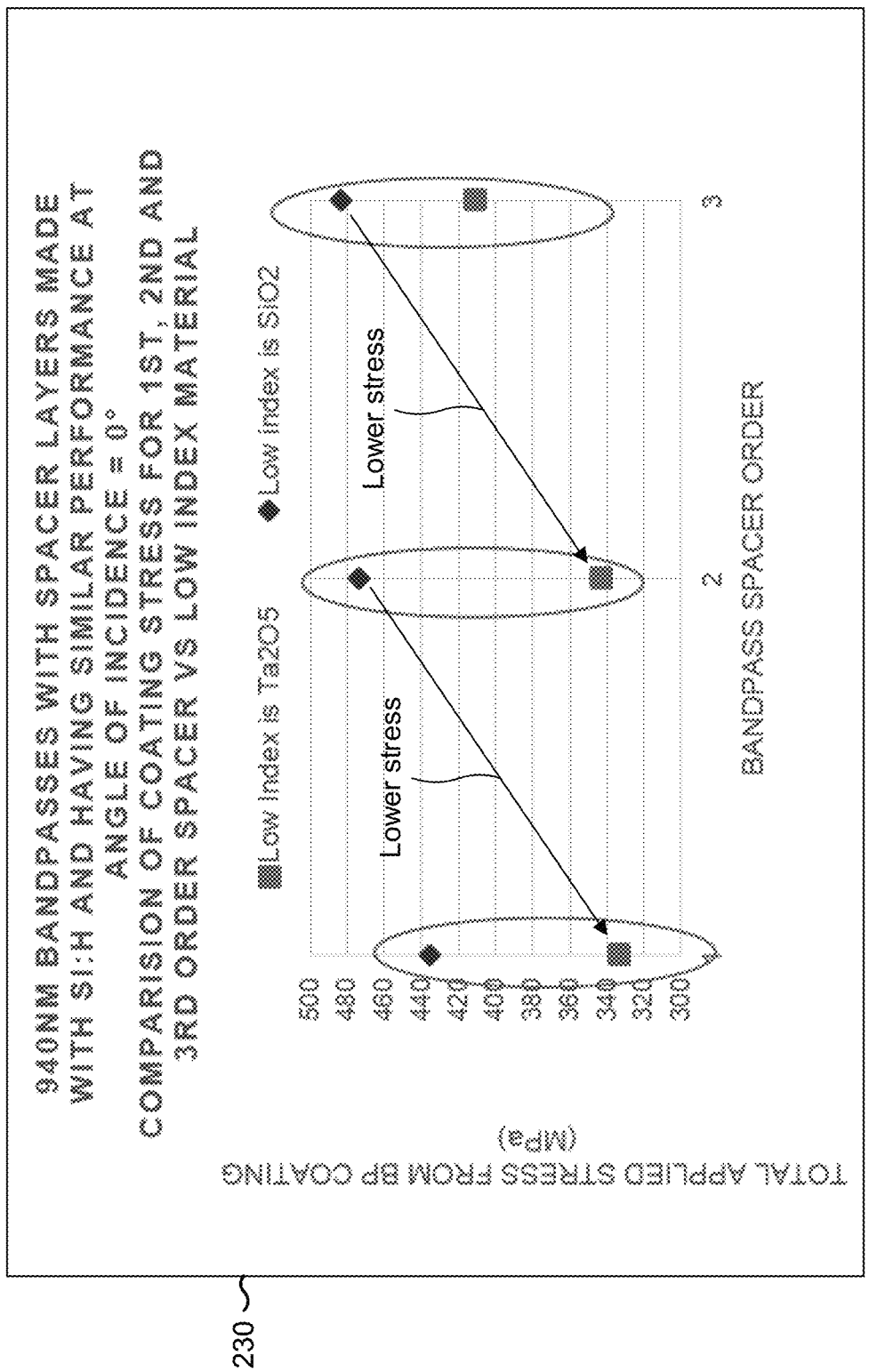

As shown in FIG. 2D, and by chart 230, using $Ta_2O_5$ for the low refractive index material may decrease an undesired stress that a coating (e.g., coating 180) applies to a substrate (e.g., substrate 120). For example, chart 230 illustrates a comparison of a total stress (in megapascals (MPa)) that is applied from a bandpass coating based on whether $Ta_2O_5$ or $SiO_2$ is used in the coating. As shown, the total applied stress is generally less for designs containing $Ta_2O_5$ relative to designs containing $SiO_2$ at any bandpass spacer order because stress applied by magnetron-sputtered $Ta_2O_5$ is substantially lower than stress applied by magnetron-sputtered $SiO_2$. Accordingly, in an optical filter having a configuration as shown in and/or described above with reference to FIGS. 1A-1C, using a material that is of a relatively lower stress may decrease stress applied to a substrate.

In this way, replacing a material with a lower refractive index (e.g., $SiO_2$) with a material that has a higher refractive index ($Ta_2O_5$) may generally decrease a bandpass angle shift, which may allow a (thinner) lower-order spacer to be used. For example, as shown in FIG. 2B, a first-order spacer that includes $Ta_2O_5$ may have a similar thickness as a second-order spacer that includes $SiO_2$, and a second-order spacer that includes $Ta_2O_5$ may have a similar thickness as a third-order spacer that includes $SiO_2$. Furthermore, as shown in FIG. 2C, a first-order spacer that includes $Ta_2O_5$ may have a similar angle shift as a second-order spacer that includes $SiO_2$, and a second-order spacer that includes $Ta_2O_5$ may have a similar angle shift as a third-order spacer that includes $SiO_2$. As further shown in FIG. 2D, moving from a second-order spacer that includes $SiO_2$ to a first-order spacer that includes $Ta_2O_5$ results in lower stress (while offering a similar angle shift and a similar thickness), and moving from a third-order spacer that includes $SiO_2$ to a second-order spacer that includes $Ta_2O_5$ similarly results in lower stress. In this way, the stress applied to a substrate by a spacer layer thickness may be reduced by using a material with a higher index while still achieving a similar angle shift. For example, although the foregoing description mentions benefits from replacing a material with a lower refractive index (e.g., $SiO_2$) with a higher index material such as $Ta_2O_5$, similar benefits may be realized with other materials that have a higher index than $SiO_2$, such as $Nb_2O_5$, $TiO_2$, and/or the like.

In some implementations, in a bandpass design with Si:H and $Ta_2O_5$, absorption at the interfaces of the Si:H and the $Ta_2O_5$ cause a lower transmission percentage. Adding very thin layers of a material that tightly binds oxygen (e.g., $SiO_2$, $Al_2O_3$, and/or the like) between the Si:H and the $Ta_2O_5$ may prevent interfacial absorption that lowers the transmission percentage. Additionally, or alternatively, adding very thin layers that do not react with oxygen (e.g., aluminum nitrite, $Si_3N_4$, and/or the like) between the Si:H and the $Ta_2O_5$ may prevent interfacial absorption that lowers the transmission percentage. In this way, interfacial absorption may be reduced, and transmission percentage may be increased without having to apply strict control over the thin layers that are added between the Si:H and the $Ta_2O_5$ because the thin layers make up a small proportion of the overall design thickness. Furthermore, for optical filters that can benefit from sharper transitions between low transmission bands and high transmission T bands, but cannot accommodate thicker coating due to stress limits, using a low-stress approach may permit more Fabry-Perot cavities to be used, which can sharpen the transitions between the low transmission bands and the high transmission T bands without exceeding the stress limit.

In this way, the particular material(s) used in the L layers 140 can be selected to decrease stress in a bandpass coating, which makes wafers less prone to warping and therefore easier to handle before singulation. Otherwise, if less warp is required, additional stress balancing coating is needed on a wafer back side, which increases costs and increases a probability that the wafer will fracture during handling. Furthermore, if there is less stress in the bandpass coating, thinner substrates can be used to manufacture an optical filter, which allows a sensor system to be made thinner with thinner optical filters, and thinner optical filters allow more flexibility during assembly with less likelihood of parts touching, which could cause damage, degrade performance, and/or the like. Furthermore, more cavities can be used to sharpen transitions without exceeding stress allowance, which may result in a better signal-to-noise ratio, and a lower angle shift in a bandpass coating may enable a narrower bandwidth for the same optical light angles and a better signal-to-noise ratio.

As indicated above, FIGS. 2A-2D are provided merely as one or more examples. Other examples may differ from what is described with regard to FIGS. 2A-2D.

FIGS. 3A-3D are diagrams of one or more examples 300 of sputter deposition systems for manufacturing one or more example implementations described herein.

Figure 3A:
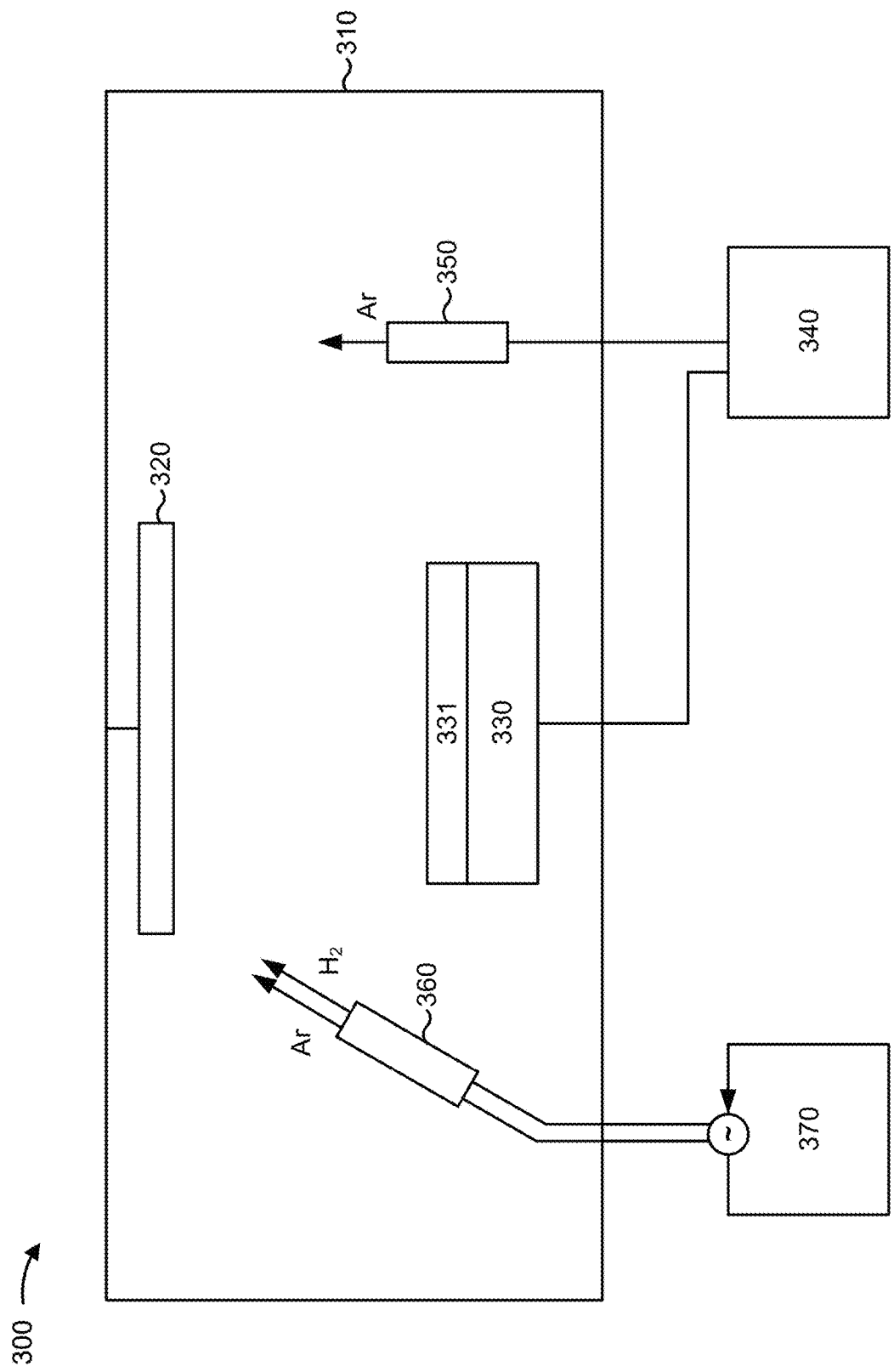
FIGS. 3A-3D are diagrams of one or more examples of sputter deposition systems for manufacturing one or more example implementations described herein.

As shown in FIG. 3A, an example sputter deposition system may include a vacuum chamber 310, a substrate 320, a cathode 330, a target 331, a cathode power supply 340, an anode 350, a plasma activation source (PAS) 360, and a PAS power supply 370. Target 331 may include a silicon material, a silicon-germanium material in a particular concentration selected based on optical characteristics of the particular concentration, and/or the like. In another example, an angle of cathode 330 may be configured to cause a particular concentration of silicon and/or silicon-germanium to be sputtered onto substrate 320, as described herein. PAS power supply 370 may be utilized to power PAS 360 and may include a radio frequency (RF) power supply. Cathode power supply 340 may be utilized to power cathode 330 and may include a pulsed direct current (DC) power supply. In this case, the sputter deposition system may cause one or more layers to be sputtered onto substrate 320 through DC sputtering.

As shown in FIG. 3A, target 331 may be sputtered in the presence of hydrogen ($H_2$), as well as an inert gas, such as argon, to deposit a hydrogenated silicon (Si:H) material, a hydrogenated silicon-germanium (SiGe:H) material, and/or the like as a layer on substrate 320. The inert gas may be provided into the chamber via anode 350 and/or PAS 360. Hydrogen is introduced into the vacuum chamber 310 through PAS 360, which serves to activate the hydrogen. Additionally, or alternatively, cathode 330 may cause hydrogen activation, in which case the hydrogen may be introduced from another part vacuum chamber 310, or anode 350 may cause hydrogen activation, in which case anode 350 may introduce the hydrogen into vacuum chamber 310. In some implementations, the hydrogen may take the form of hydrogen gas, a mixture of hydrogen gas and a noble gas (e.g., argon gas), and/or the like. PAS 360 may be located within a threshold proximity of cathode 330, allowing plasma from PAS 360 and plasma from cathode 330 to overlap. The use of PAS 360 may allow the Si:H and/or SiGe:H layer to be deposited at a relatively high deposition rate. In some implementations, the Si:H and/or SiGe:H layer is deposited at a deposition rate of approximately 0.05 nm/s to approximately 2.0 nm/s, at a deposition rate of approximately 0.5 nm/s to approximately 1.2 nm/s, at a deposition rate of approximately 0.8 nm/s, and/or the like.

Although the sputtering procedure is described herein in terms of a particular geometry and a particular implementation, other geometries and other implementations are possible. For example, hydrogen may be injected from another direction, from a gas manifold in a threshold proximity to cathode 330, and/or the like.

Figure 3B:
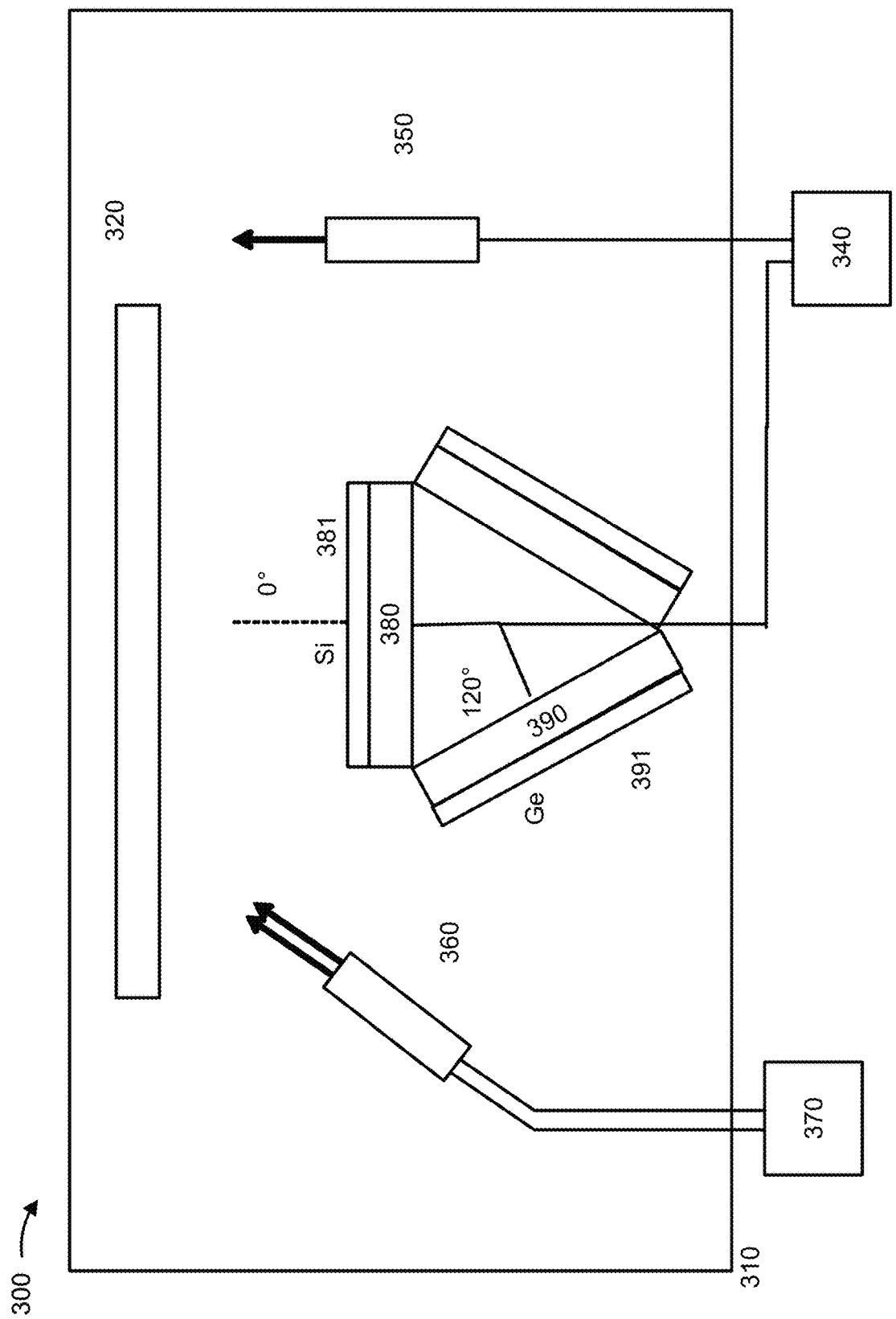
Figure 3C:
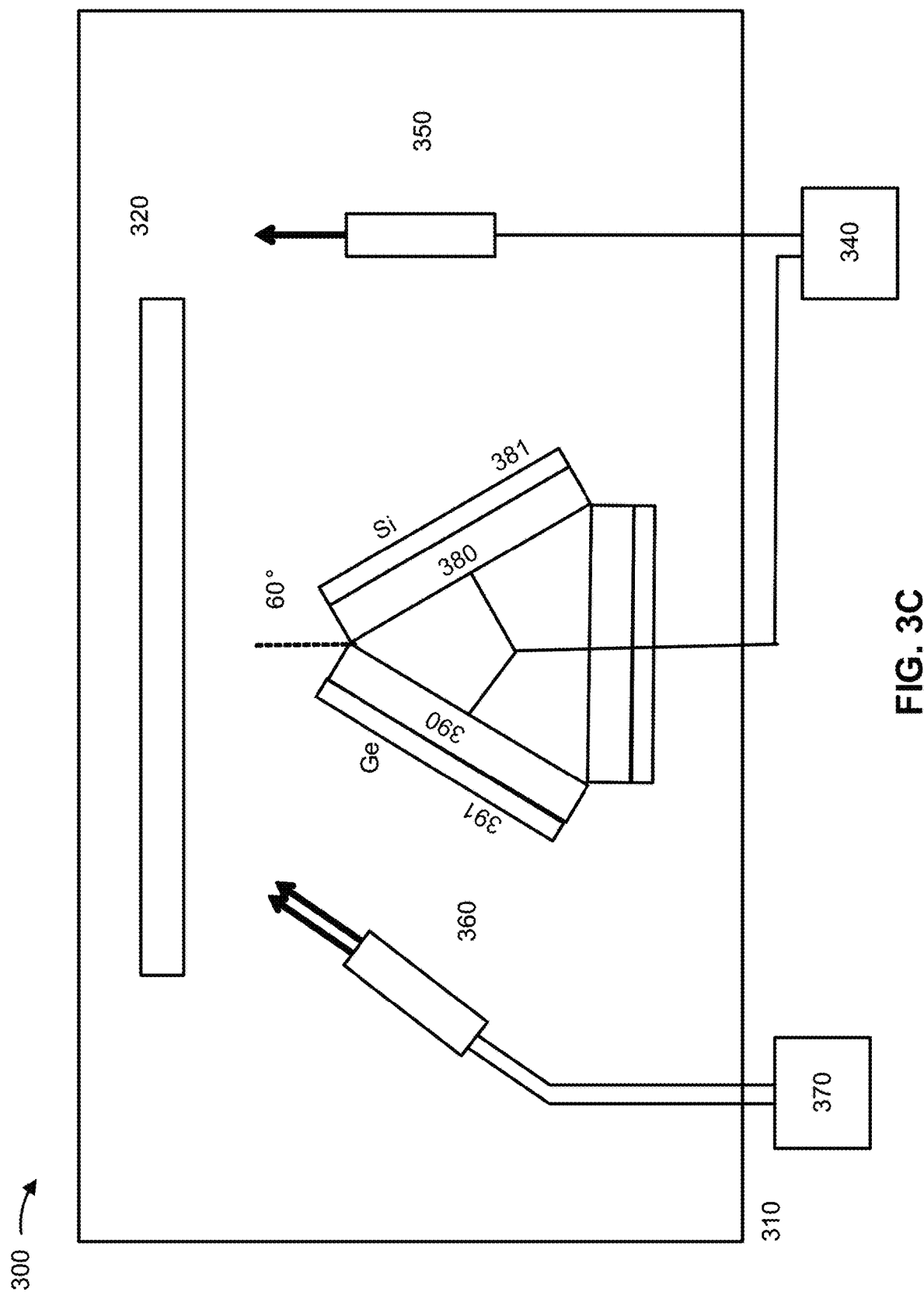

As shown in FIGS. 3B-3C, a similar sputter deposition system includes a vacuum chamber 310, a substrate 320, a first cathode 380, a second cathode 390, a first target 381, a second target 391, a cathode power supply 340, an anode 350, a PAS 360, and a PAS power supply 370. In this case, the first target 381 may be a silicon target and the second target 391 may be a germanium target. Accordingly, as described herein, the first target 381 may be referred to as silicon target 381 and the second target 391 may be referred to as germanium target 391. However, it will be appreciated that that the first target 381 and/or the second target 391 may be made from other suitable materials to form a high refractive index material layer.

As shown in FIG. 3B, silicon target 381 is oriented at approximately 0 degrees relative to substrate 320 (e.g., approximately parallel to substrate 320) and germanium target 391 is oriented at approximately 120 degrees relative to substrate 320. In this case, silicon and germanium are sputtered by cathode 380 and cathode 390, respectively from silicon target 381 and germanium target 391, respectively, onto substrate 320.

As shown in FIG. 3C, in a similar sputter deposition system, silicon target 381 and germanium target 391 are each oriented at approximately 60 degrees relative to substrate 320, and silicon and germanium are sputtered by cathode 380 and cathode 390, respectively, from silicon target 381 and germanium target 391, respectively, onto substrate 320.

Figure 3D:
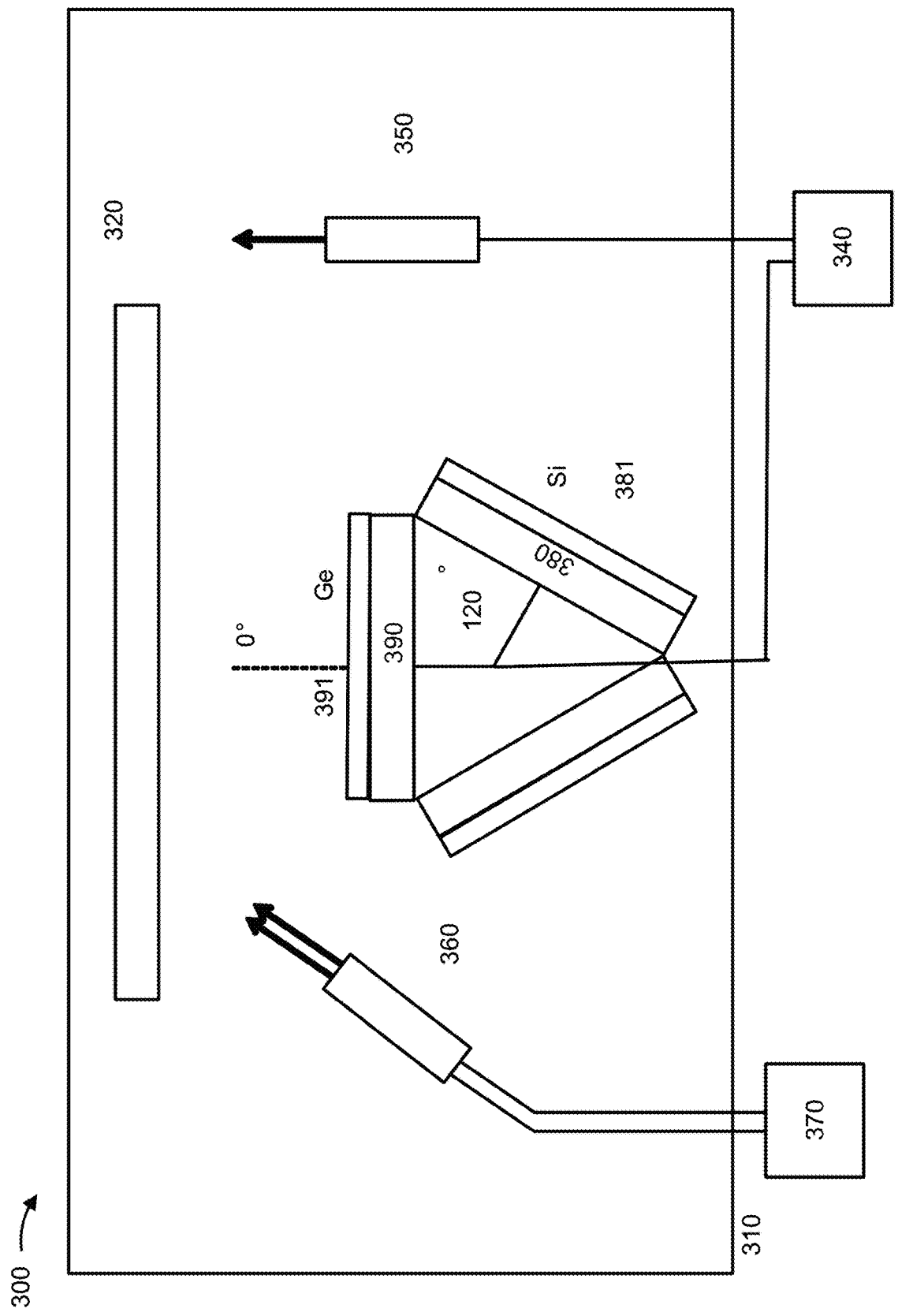

As shown in FIG. 3D, in a similar sputter deposition system, silicon target 381 is oriented at approximately 120 degrees relative to substrate 320 and germanium target 391 is oriented at approximately 0 degrees relative to substrate 320. In this case, silicon and germanium are sputtered by cathode 380 and cathode 390, respectively from silicon target 381 and germanium target 391, respectively, onto substrate 320.

With regard to FIGS. 3A-3D, each configuration of components in a silicon sputter deposition system may result in a different relative concentration of silicon, silicon and germanium, and/or the like. Although described herein in terms of different configurations of components, different relative concentrations of silicon and germanium may also be achieved using different materials, different manufacturing processes, and/or the like.

As indicated above, FIGS. 3A-3D are provided merely as one or more examples. Other examples may differ from what is described with regard to FIGS. 3A-3D.

Figure 4A:
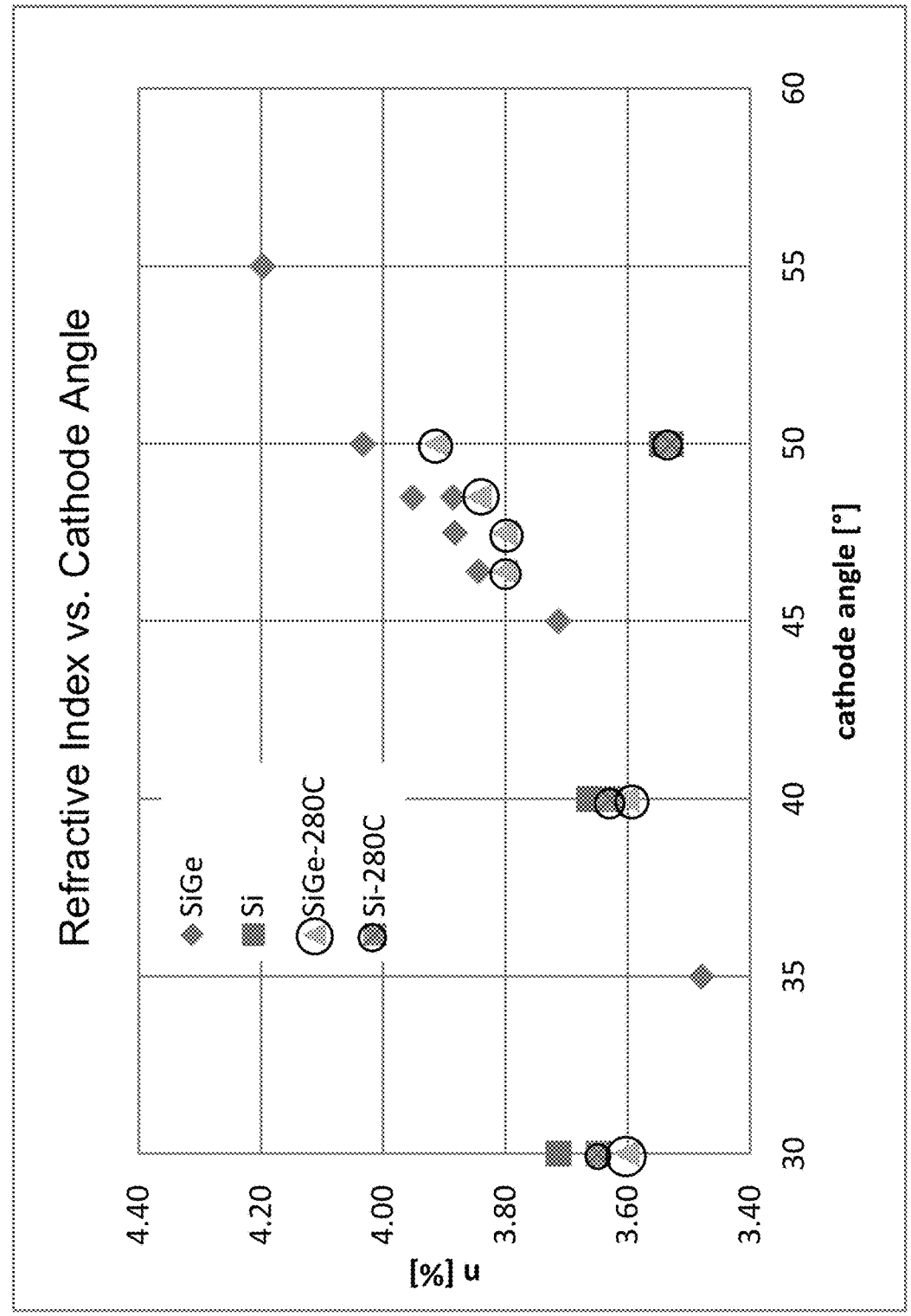
FIGS. 4A-4B are diagrams of one or more examples of optical characteristics for a set of materials related to one or more example implementations described herein.
Figure 4B:
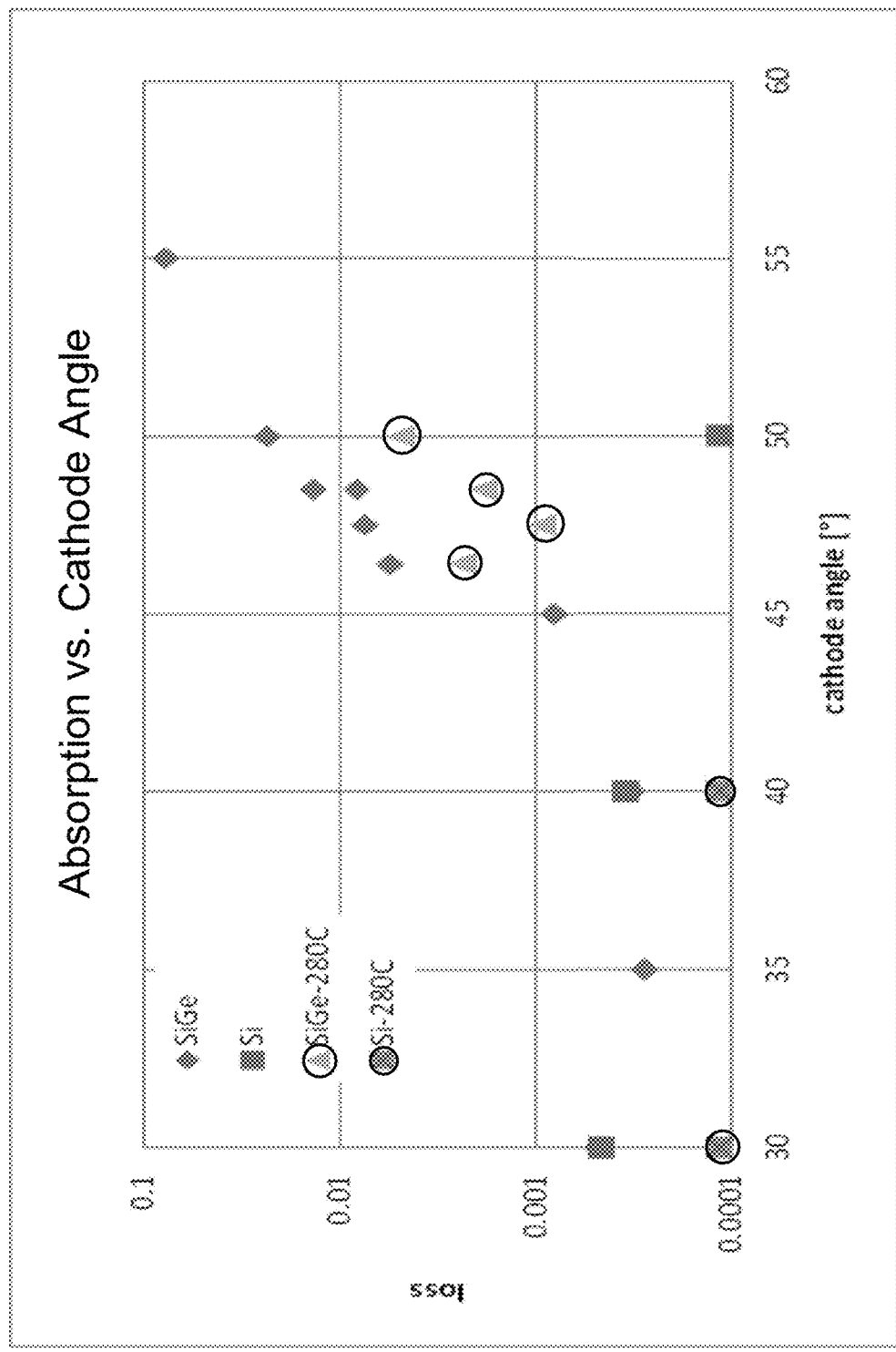

FIGS. 4A-4B are diagrams of one or more examples of optical characteristics for a set of materials related to one or more example implementations described herein.

As shown in FIG. 4A, and by chart 410, a set of characteristics are determined, for example, for a SiGe layer (e.g., a SiGe:H layer for use in an optical filter). In general, an increase in a cathode angle of a cathode sputtering silicon may correspond to an increased germanium content in the optical filter relative to a silicon content, as described in further detail with regard to FIGS. 3B-3D. For example, for high refractive index layers of an optical filter, deposited at 30 degrees, the high refractive index layer may be associated with an approximately 7.5% germanium content. Similarly, for deposition at 35 degrees the optical filter may be associated with an approximately 22% germanium content, and for deposition at 50 degrees the optical filter may be associated with an approximately 90% germanium content.

As further shown in FIG. 4A, and by chart 410, a refractive index n at a wavelength of 950 nm is provided for a set of layers based on a cathode angle (in degrees) at which sputtering is performed to sputter material to form the set of high refractive index material layers. As shown, for silicon-germanium (SiGe) and annealed silicon-germanium (SiGe-280C) (e.g., silicon-germanium for which an annealing procedure has been performed at 280 degrees Celsius (C)), an increase in cathode angle corresponds to an increase in refractive index. Moreover, the refractive index for silicon layers including germanium is greater than for silicon not including germanium, such as a silicon (Si) based optical filter and an annealed silicon (Si-280C) based optical filter, thereby improving performance of an optical filter that includes SiGe layers.

As shown in FIG. 4B, and by chart 420, another set of optical characteristics are determined for the set of high refractive index material layers. As shown, an absorption at a wavelength of 950 nm may be determined in relation to a type of material for the high refractive index material layers and a cathode angle used in a sputtering procedure to deposit the high refractive index layers. For example, increased germanium content (e.g., increased cathode angle) is generally associated with increased absorption (or loss). However, annealed SiGe (SiGe-280C) is associated with a reduced absorption for an optical filter associated with a similar cathode angle relative to non-annealed SiGe. For example, annealed SiGe may be associated with a loss value that satisfies an absorption threshold for utilization in optical filters at a cathode angle that corresponds to a refractive index that satisfies a refractive index threshold for utilization in low angle shift for an optical filter. In this way, annealing SiGe (or SiGe:H) may permit SiGe (or SiGe:H) to be used as a low angle shift coating with a relatively high refractive index and without an excessive absorption of NIR light.

As indicated above, FIGS. 4A and 4B are provided merely as one or more examples. Other examples and may differ from what is described with regard to FIGS. 4A and 4B.

Figure 5A:
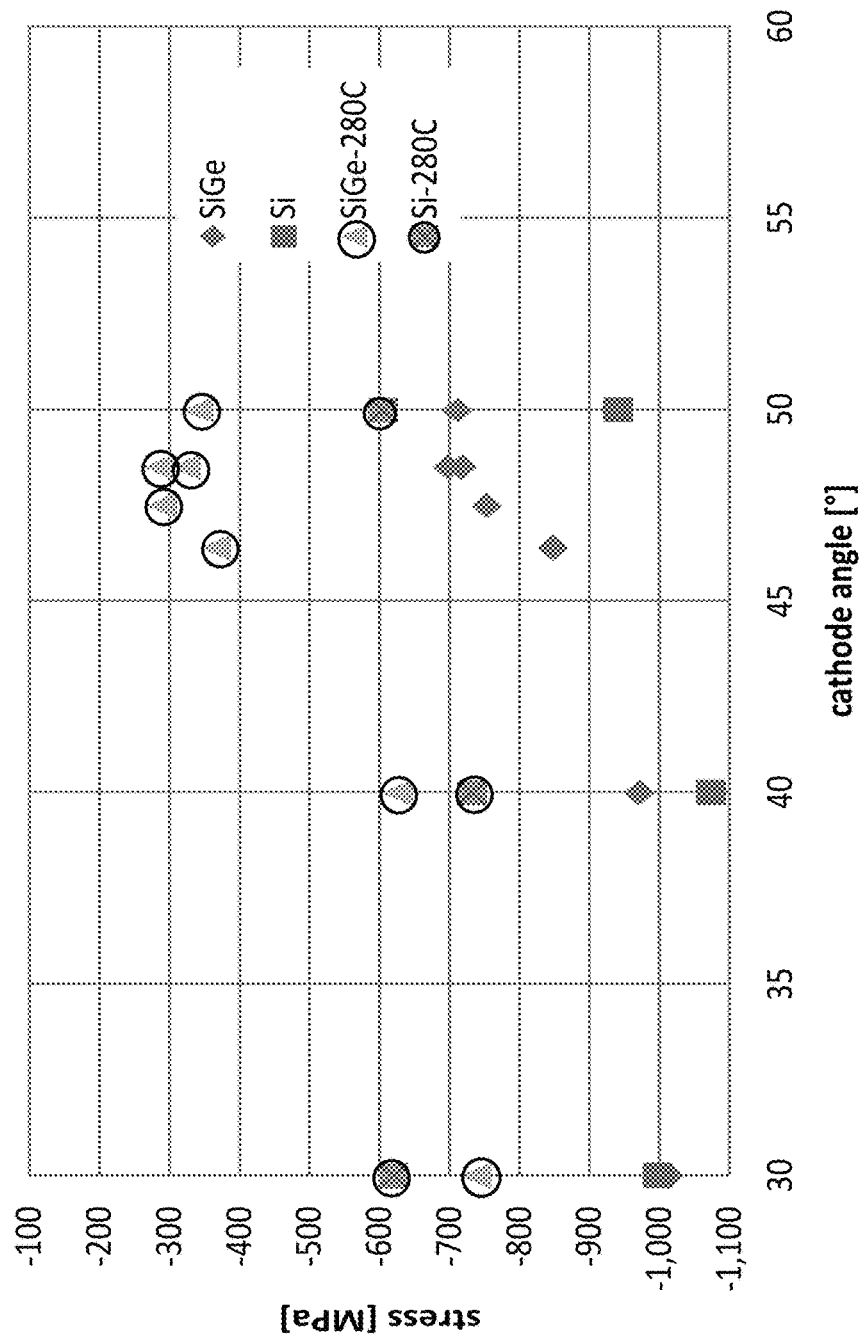
FIG. 5A is a diagram of one or more examples of mechanical characteristics for a set of materials related to one or more implementations described herein.
Figure 5B:
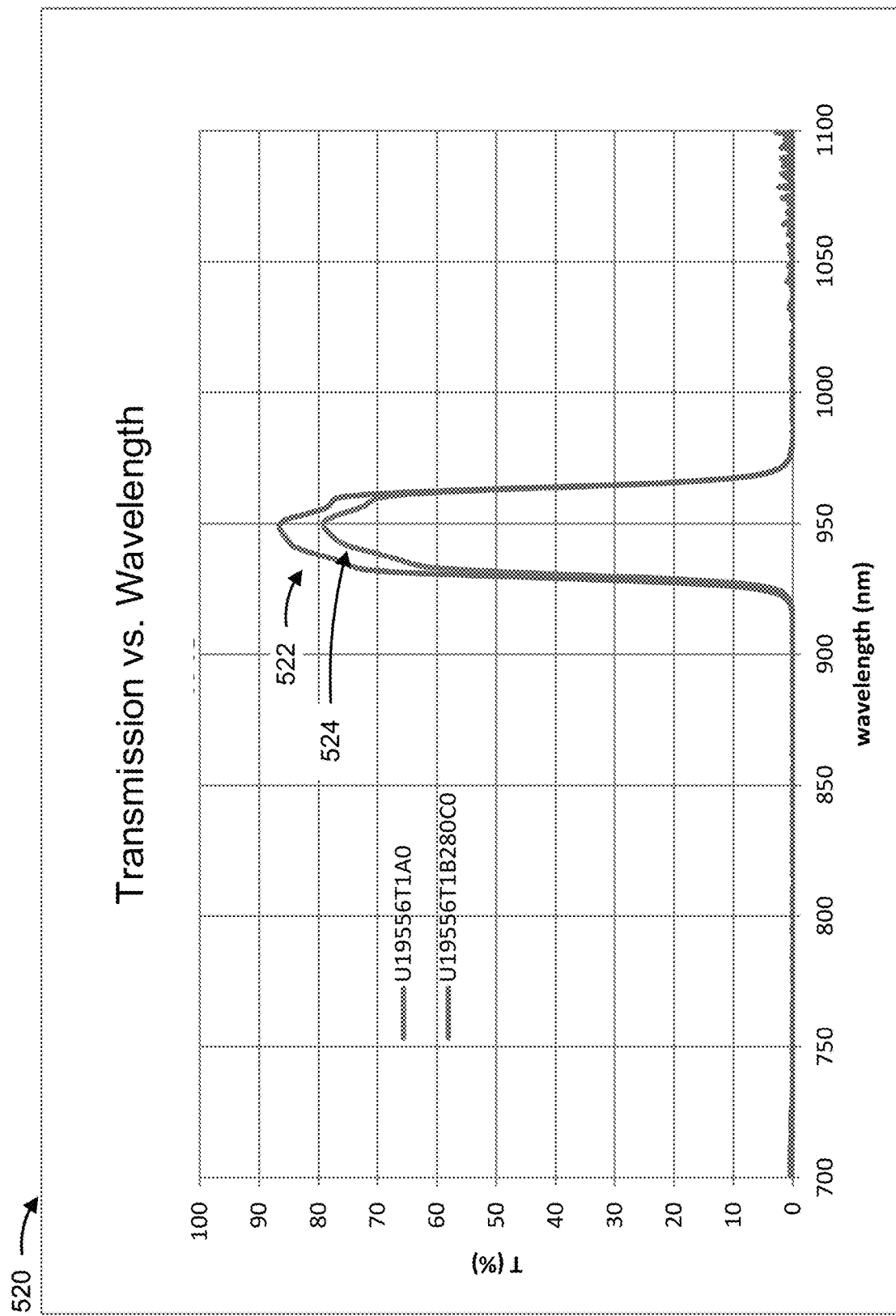
FIG. 5B is a diagram of one or more examples of optical characteristics for a set of materials related to one or more example implementations described herein.

FIGS. 5A-5B are diagrams of one or more examples of characteristics for a set of materials related to one or more implementations described herein.

As shown in FIG. 5A, and by chart 510, a set of mechanical characteristics are determined for the set of high refractive index material layers. As shown, a stress value (in megapascals (MPa)) may be determined in relation to a type of material for the high refractive index material layers and a cathode angle used for a sputtering procedure to deposit the high refractive index material layers. The stress value may be a compressive stress on the high refractive index material layer as a result of the sputtering procedure. For example, increased germanium content (e.g., increased cathode angle) is associated with decreased stress for a SiGe layer. As shown, at similar cathode angles, annealed SiGe is associated with a reduced stress value relative to non-annealed SiGe. For example, annealed SiGe may be associated with a stress value that satisfies a stress threshold for utilization in optical filters at a cathode angle that corresponds to a refractive index that satisfies a refractive index threshold for utilization in optical filters. Reduced stress value may reduce a difficulty in manufacture when the manufacturing procedure includes cutting a wafer into multiple portions for multiple optical filters. Moreover, a reduced stress value may permit a reduced thickness substrate relative to another type of material with a greater stress value. In this way, annealing SiGe (or SiGe:H) may permit SiGe (or SiGe:H) to be used as a low angle shift coating with a relatively high refractive index and without an excessive stress value, thereby improving manufacturability of an optical filter and reducing a thickness of the optical filter relative to a non-annealed optical filter and especially if compared to optical filters using pure silicon.

As shown in FIG. 5B, and by chart 520, a set of optical characteristics are determined for a set of bandpass filters center at a 950 nm wavelength. As shown, a transmissivity percentage of a first optical filter and a second optical filter is determined in relation to a utilization of annealing and a wavelength of light. For example, in FIG. 5B, reference number 522 may correspond to a first optical filter and reference number 524 may correspond to a second optical filter, each of which may be associated with generally similar parameters (e.g., a set of 4 cavities, a 3.1 micrometer thickness, a set of high refractive index layers that include SiGe, a set of low refractive index layers that include silicon dioxide ($SiO_2$), no anti-reflective coating on the second side, and a cathode angle of 47.5 degrees (e.g., which may correspond to approximately 80% germanium for the set of high refractive index layers). However, in FIG. 5B, reference number 522 may correspond to a first optical filter in which one or more of the high refractive index layers are formed using annealing and reference number 524 may correspond to a second optical filter in which no annealing is utilized.

Accordingly, as shown in FIG. 5B, and by reference numbers 522 and 524, utilization of annealing improves transmissivity at approximately 950 nm by approximately 7% (e.g., to greater than 80% or approximately 85% at approximately 950 nm) relative to not utilizing annealing of an optical filter. For example, as shown by reference number 524, transmissivity at approximately 950 nm may be less than 80% when no annealing is utilized. In this way, annealing SiGe (or SiGe:H) may permit SiGe (or SiGe:H) to be used as a low angle shift coating with improved transmissivity relative to a non-annealed optical filter. In another example, including an anti-reflective coating (e.g., on a backside surface of the optical filter) may improve transmissivity by an additional approximately 5% relative to the first optical filter without an anti-reflective coating.

Although FIG. 5B shows an example relating to a particular set of characteristics of the first optical filter and the second optical filter, other examples described herein may exhibit similarly improved performance with annealing for other characteristics of an optical filter.

Although FIG. 5B shows an example relating to optical characteristics of a bandpass filter, similarly improved optical characteristics may be associated with manufacture of a shortwave pass filter, a long wave pass filter, an anti-reflective coating, a non-polarizing beam splitter, a polarizing beam splitter, a dielectric reflector, a multi-bandpass filter, a notch filter, a multi-notch filter, a neutral density filter, and/or the like.

As indicated above, FIGS. 5A and 5B are provided merely as one or more examples. Other examples may differ from what is described with regard to FIGS. 5A and 5B.

Figure 6A:
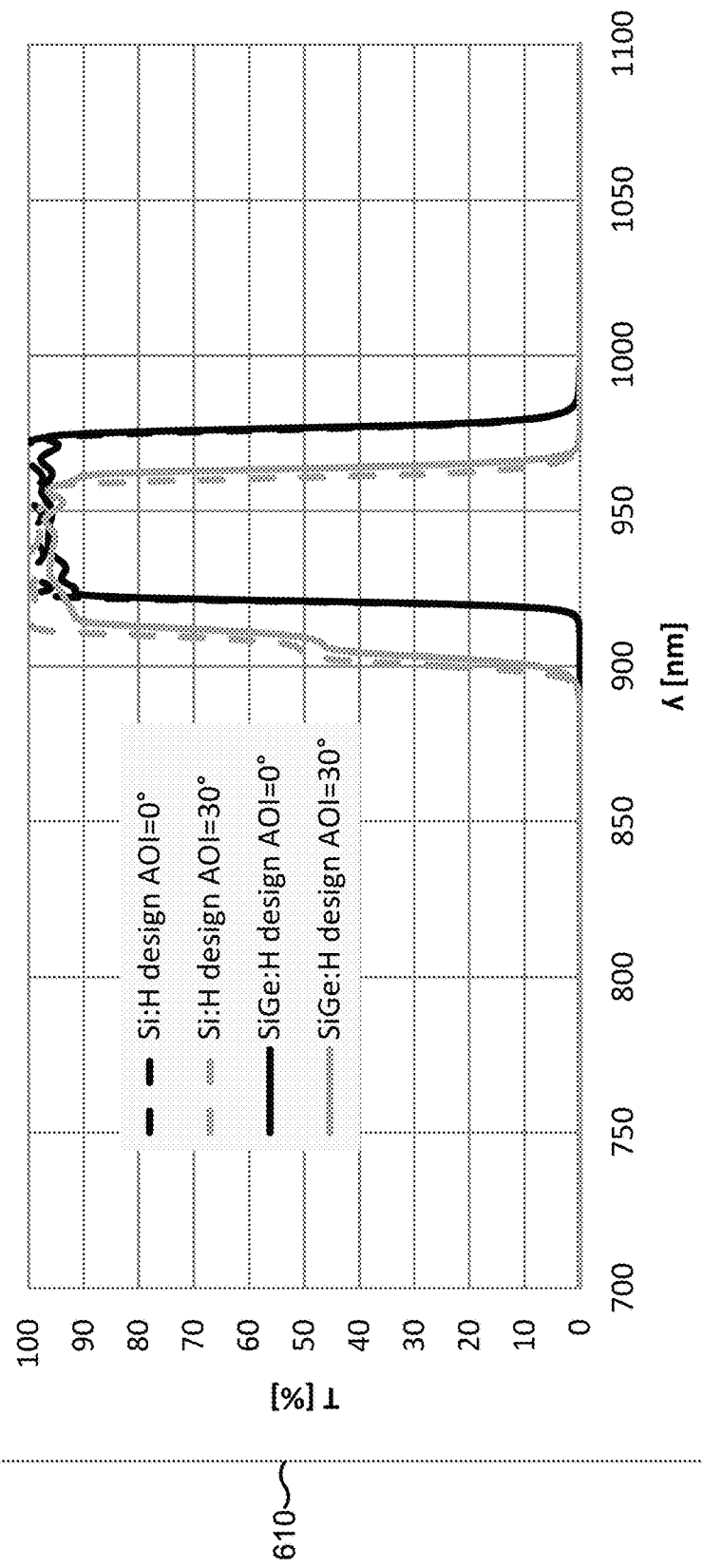
FIGS. 6A-6B are diagrams of one or more examples of optical characteristics for a set of materials related to one or more example implementations described herein.
Figure 6B:
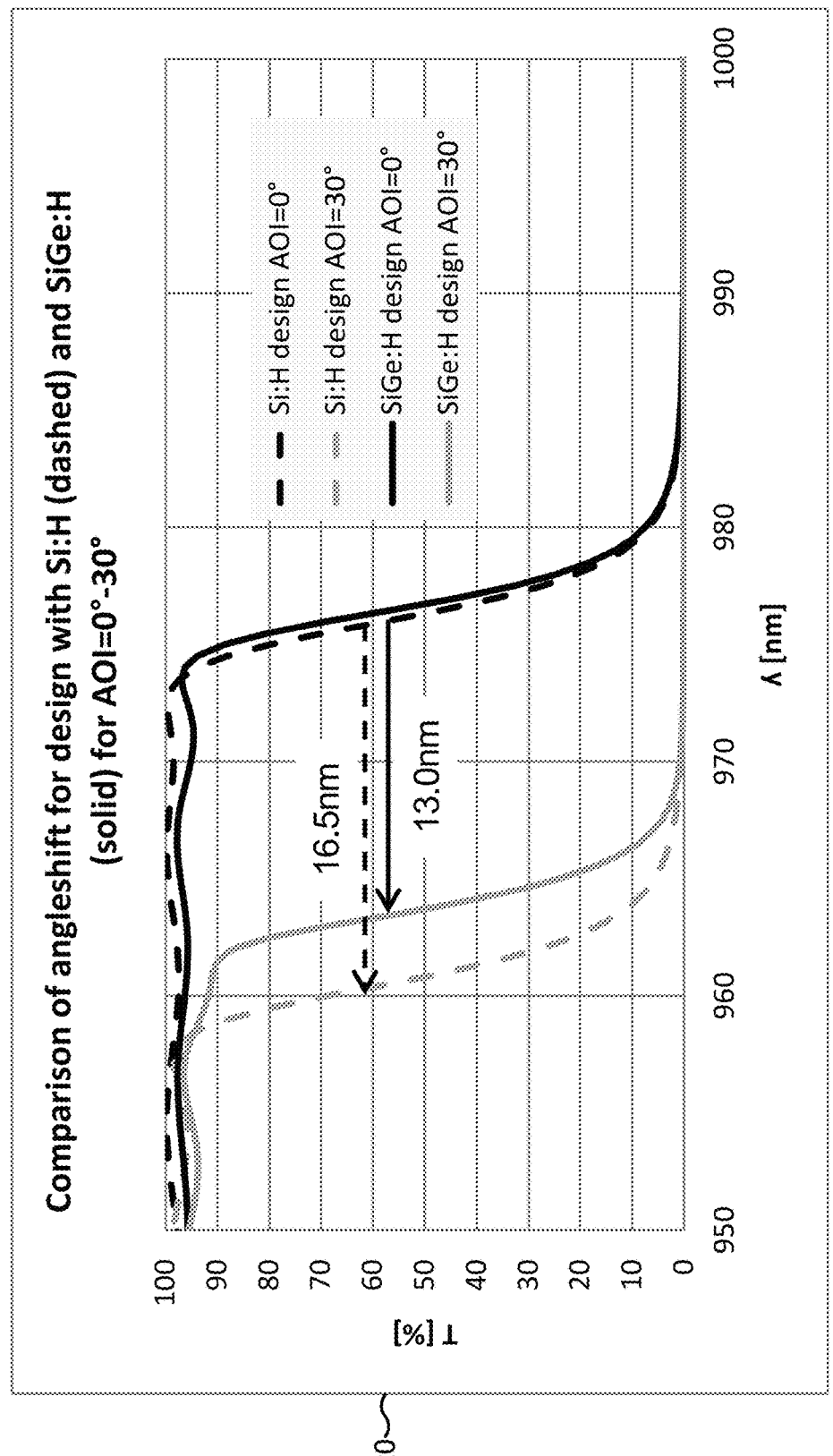

FIGS. 6A-6C are diagrams of one or more examples 600 of characteristics for a set of materials related to one or more example implementations described herein.

As shown in FIG. 6A, and by chart 610, a set of optical characteristics are shown for a set of optical filters that include a hydrogenated silicon (Si:H) based optical filter and a hydrogenated silicon-germanium (SiGe:H) based optical filter. In this case, the set of optical filters may utilize silicon dioxide ($SiO_2$) as a low refractive index material. As shown, a transmission percentage at a set of wavelengths is determined for the set of optical filters. In this case, the SiGe:H optical filter is associated with a refractive index of 3.871 at 950 nm and the Si:H optical filter is associated with a refractive index of 3.740 at 950 nm. As a result of the SiGe:H optical filter having a higher refractive index than the Si:H optical filter, the SiGe:H optical filter may be associated with a reduced physical thickness. For example, the Si:H optical filter may be associated with a 6.3 micrometer thickness and the SiGe:H optical filter may be associated with a 5.4 micrometer thickness. Additionally, the SiGe:H optical filter may be associated with a greater blocking efficiency (e.g., the SiGe:H optical filter may be more absorbing at approximately 700 nm than the Si:H optical filter resulting in a reduced quarter wave stack coating to block a wavelength range including 700 nm).

As shown in FIG. 6B, chart 620 shows a portion of chart 610 at a wavelength range of 950 nanometers to 1000 nanometers. As shown in chart 620, the angle shift is shown to be 16.5 nm for the Si:H optical filter at an angle of incidence (AOI) from 0 degrees to 30 degrees and 13.0 nm for the SiGe:H optical filter at an angle of incidence from 0 degrees to 30 degrees. In this case, the SiGe:H optical filter is shown to have a reduced angle shift relative to the Si:H optical filter resulting in improved optical performance.

As shown in FIG. 6C, and by chart 630, a design of Si:H optical filters and SiGe:H optical filters, such as the optical filters of FIGS. 1A-1C and a set of optical characteristics are shown. As shown, the set of optical filters are associated with a substrate size of 200 mm to 300 mm and a substrate thickness of 0.15 mm to 0.7 mm. For each wafer size and wafer thickness, the SiGe:H optical filter is associated with a reduced substrate deflection relative to the Si:H optical filter. In this way, durability and manufacturability of an optical filter is improved. Moreover, based on reducing a stress value, a substrate size may be increased for a similar substrate thickness relative to other substrate designs, based on reducing a likelihood of breaking relative to other substrate designs with higher stress values.

As indicated above, FIGS. 6A-6C are provided merely as one or more examples. Other examples and may differ from what is described with regard to FIGS. 6A-6C.

Figure 7A:
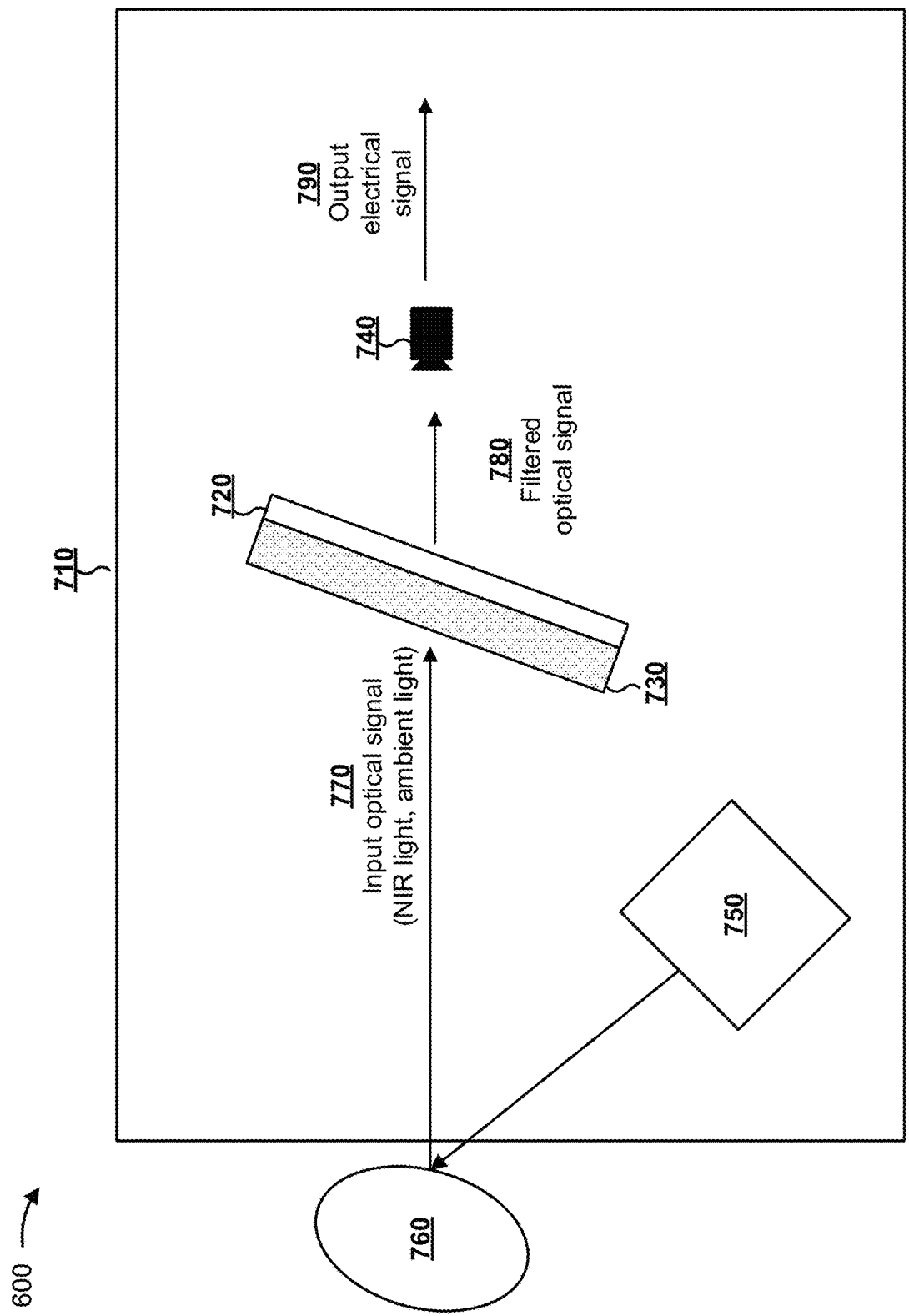
FIGS. 7A-7B are diagrams of one or more example implementations described herein.
Figure 7B:
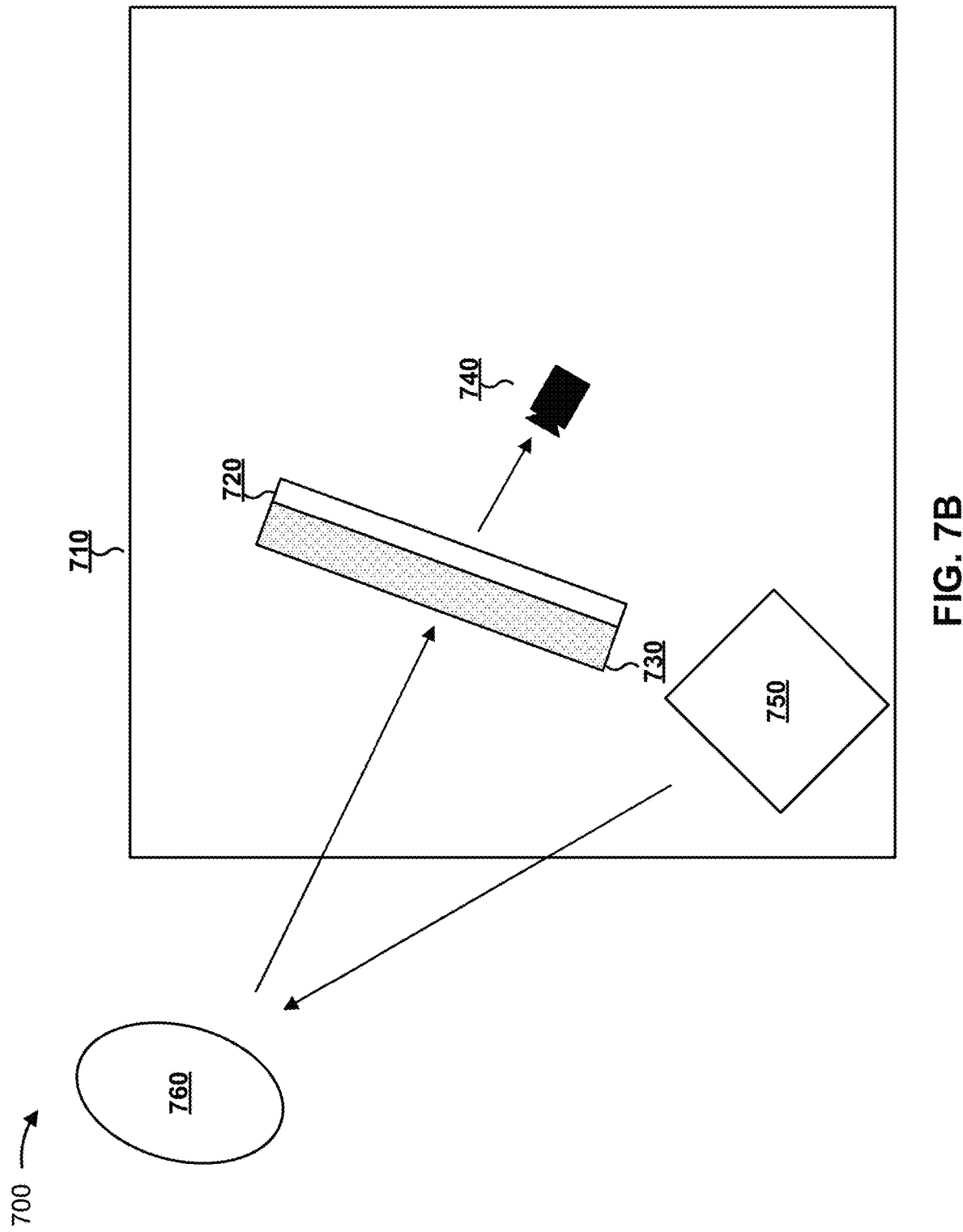

FIGS. 7A-7B are diagrams of one or more example implementations 700 described herein. As shown in FIG. 7A, example implementation(s) 700 may include a sensor system 710. Sensor system 710 may be a portion of an optical system, and may provide an electrical output corresponding to a sensor determination. Sensor system 710 includes an optical filter structure 720, which includes an optical filter 730, and an optical sensor 740. For example, optical filter structure 720 may include an optical filter 730 that performs a passband filtering functionality or another type of optical filter. Sensor system 710 includes an optical transmitter 750 that transmits an optical signal toward a target 760 (e.g., a person, an object, and/or the like).

Although implementations may be described herein in terms of an optical filter in a sensor system, implementations described herein may be used in another type of system, may be used external to the sensor system, and/or the like. In some implementations, optical filter 730 may perform a polarization beam splitting functionality for the light. For example, optical filter 730 may reflect a first portion of the light with a first polarization and may pass through a second portion of the light with a second polarization when the second polarization is desired to be received by the optical sensor 740, as described herein. Additionally, or alternatively, optical filter 730 may perform a reverse polarization beam splitting functionality (e.g., beam combining) for the light.

As further shown in FIG. 7A, and by reference number 770, an input optical signal is directed toward optical filter structure 720. The input optical signal may include NIR light emitted by optical transmitter 750 and ambient light from the environment in which sensor system 710 is being utilized. For example, when optical filter 730 is a bandpass filter, optical transmitter 750 may direct near infrared (NIR) light toward a user for a gesture recognition system (e.g., of a gesture performed by target 760), and the NIR light may be reflected off target 760 (e.g., a user) toward optical sensor 740 to permit optical sensor 740 to perform a measurement of the NIR light. In this case, ambient light may be directed toward optical sensor 740 from one or more ambient light sources (e.g., a light bulb or the sun). In another example, multiple light beams may be directed toward target 760 and a subset of the multiple light beams may be reflected toward optical filter structure 720, which may be disposed at a tilt angle relative to optical sensor 740, as shown. In some implementations, another tilt angle may be used (e.g., a 0 degree tilt angle for a bandpass filter). In some implementations, optical filter structure 720 may be disposed and/or formed directly onto optical sensor 740, rather than being disposed a distance from optical sensor 740. For example, optical filter structure 720 may be coated and patterned onto optical sensor 740 using, for example, photolithography. In some examples, optical filter structure 720 may include any element of optical filter 100, 100', 100" described above, including substrate 120, coating 180, and/or the like. In another example, optical transmitter 750 may direct NIR light toward another type of target 760, such as for detecting objects in proximity to a vehicle, detecting objects in proximity to a blind person, detecting a proximity to an object (e.g., using a LIDAR technique), and/or the like, and the NIR light and ambient light may be directed toward optical sensor 740 as a result.

As further shown in FIG. 7A, and by reference number 780, a portion of the optical signal is passed by optical filter 730 and optical filter structure 720. For example, optical filter 730 may include any of optical filter coating portion 110 of the optical filter 100, 100', 100" described above and may cause the first polarization of light to be reflected in a first direction. In this case, optical filter 730 blocks visible light of the input optical signal without excessively blocking NIR light and without introducing an excessive angle-shift with an increase in an angle of incidence of the input optical signal.

As further shown in FIG. 7A, and by reference number 790, based on the portion of the optical signal being passed to optical sensor 740, optical sensor 740 may provide an output electrical signal for sensor system 710, such as for use in recognizing a gesture of the user or detecting the presence of an object. In some implementations, another arrangement of optical filter 730 and optical sensor 740 may be utilized. For example, rather than passing the second portion of the optical signal collinearly with the input optical signal, optical filter 730 may direct the second portion of the optical signal in another direction toward a differently located optical sensor 740. In another example, optical sensor 740 may be an avalanche photodiode, an Indium-Gallium-Arsenide (InGaAs) detector, an infrared detector, and/or the like.

As shown in FIG. 7B, a similar example implementation 700 may include sensor system 710, optical filter structure 720, optical filter 730, optical sensor 740, optical transmitter 750, and target 760. FIG. 7B shows a particular example implementation 700 that includes an optical filter 730 as described herein.

Optical transmitter 750 emits light at an emission wavelength in a wavelength range of 800 nm to 1100 nm. Optical transmitter 750 emits modulated light (e.g., light pulses). Optical transmitter 750 may be a light-emitting diode (LED), an LED array, a laser diode, or a laser diode array. Optical transmitter 750 emits light towards target 760, which reflects the emitted light back towards sensor system 710. When sensor system 710 is a gesture-recognition system, target 760 is a user of the gesture-recognition system. Sensor system 710 may also be a proximity sensor system, a three-dimensional (3D) imaging system, distance sensing system, a depth sensor, and/or another suitable sensor system.

Optical filter 730 is disposed to receive the emitted light after reflection by target 760. Optical filter 730 has a passband including the emission wavelength and at least partially overlapping with the wavelength range of 800 nm to 1100 nm. Optical filter 730 is a bandpass filter, such as a narrow bandpass filter. Optical filter 730 transmits the emitted light from the optical transmitter 750, while substantially blocking ambient light.

Optical sensor 740 is disposed to receive the emitted light after transmission by optical filter 730. In some implementations, optical filter 730 is formed directly on optical sensor 740. For example, optical filter 730 may be coated and patterned (e.g., by photolithography) on sensors (e.g., proximity sensors) in wafer level processing (WLP).

When sensor system 710 is a proximity sensor system, optical sensor 740 is a proximity sensor, which detects the emitted light to sense a proximity of target 760. When sensor system 710 is a 3D-imaging system or a gesture-recognition system, optical sensor 740 is a 3D image sensor (e.g., a charge-coupled device (CCD) chip or a complementary metal oxide semiconductor (CMOS) chip), which detects the emitted light to provide a 3D image of target 760, which, for example, is the user. The 3D image sensor converts the optical information into an electrical signal for processing by a processing system (e.g., an application-specific integrated circuit (ASIC) chip or a digital signal processor (DSP) chip). For example, when sensor system 710 is a gesture-recognition system, the processing system processes the 3D image of the user to recognize a gesture of the user.

As indicated above, FIGS. 7A-7B are provided merely as one or more example. Other examples may differ from what is described with regard to FIGS. 7A-7B.

In this way, a set of hydrogenated silicon (Si:H) layers, a set of SiGe based layers, a set of hydrogenated SiGe (SiGe:H) layers, and/or the like may be used as a high refractive index material for an optical filter coating of an optical filter to provide out-of-band blocking of visible light, transmission of NIR light, and/or filtering of light with a reduced angle shift relative to another type of material used for a set of high refractive index layers. Moreover, based on using Si:H, SiGe, SiGe:H, and/or the like and/or an annealing procedure, out-of-band blocking and in-band transmission are improved relative to another type of material.

Figure 8A:
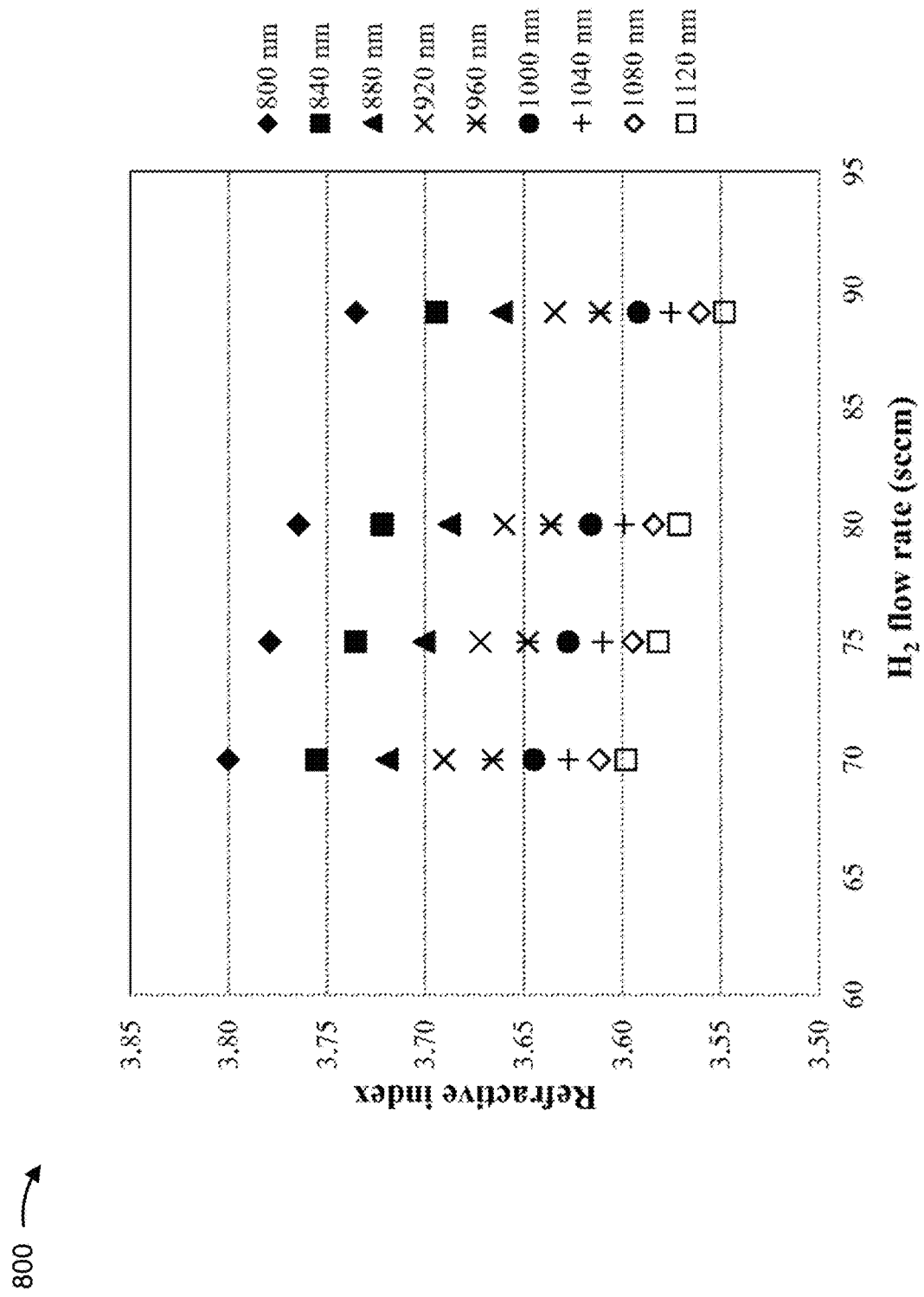
FIG. 8A is a plot of an example of refractive indexes for hydrogenated silicon layers.

FIG. 8A shows a plot of refractive indices at wavelengths of 800 nm to 1120 nm relative to hydrogen flow rate for as-deposited Si:H layers. As shown, the refractive index generally decreases with increasing hydrogen flow rate. Generally, the refractive index varies approximately linearly with hydrogen flow rate. In particular, the refractive index of the Si:H layer produced at a hydrogen flow rate of 80 standard cubic centimeters per minute (sccm) is greater than 3.55 over the wavelength range of 800 nm to 1120 nm. In some implementations, the refractive index is greater than 3.65 at 800 nm, greater than 3.7, greater than 3.75, and about 3.8 at 800 nm.

Figure 8B:
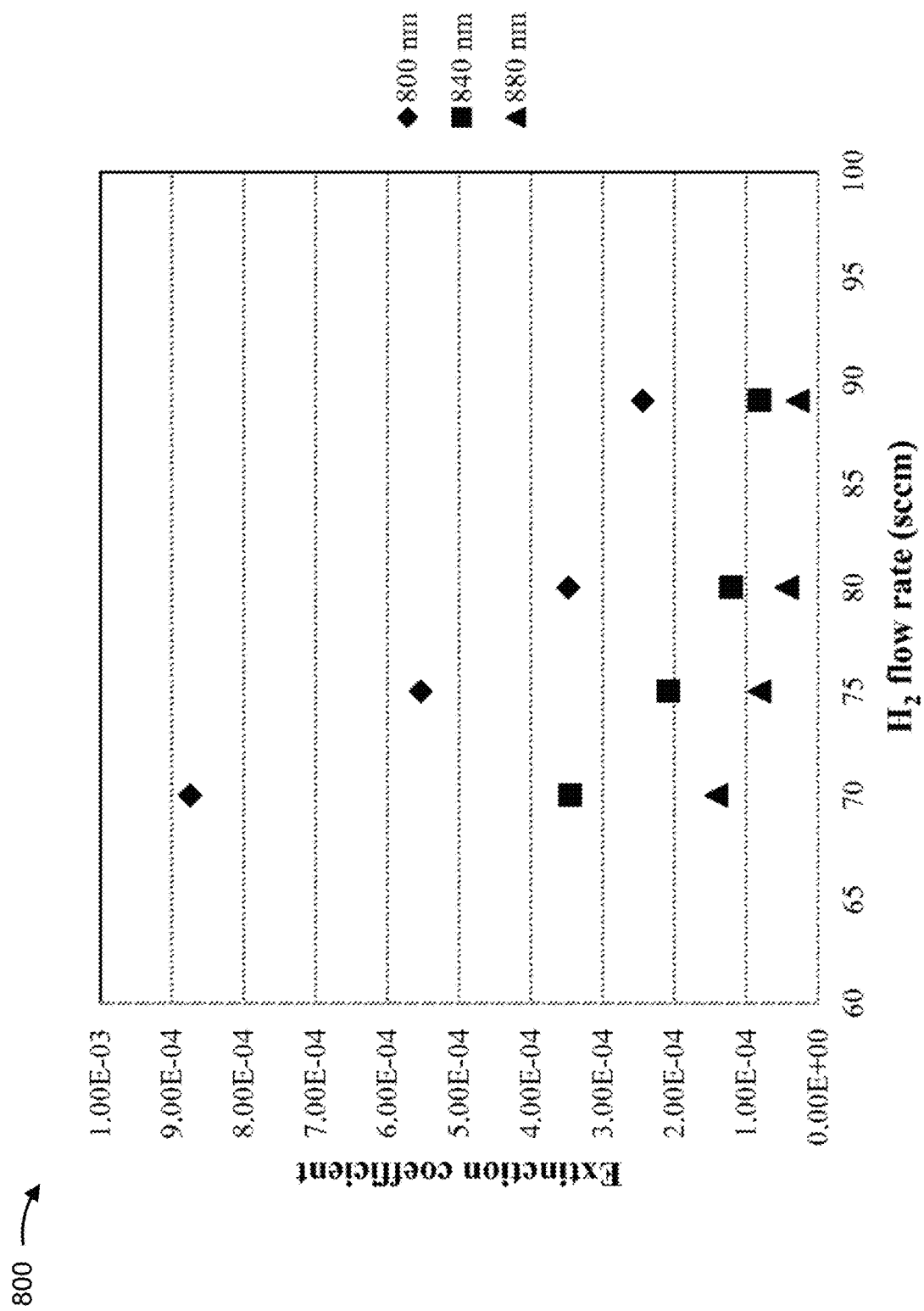
FIG. 8B is a plot of an example of extinction coefficients for hydrogenated silicon layers.

FIG. 8B shows a plot of extinction coefficients at wavelengths of 800 nm to 880 nm against hydrogen flow rate for as-deposited Si:H layers (the absorption coefficient is less than 0.0001 at wavelengths of 920 nm to 1120 nm). The extinction coefficient (e.g., absorption coefficient) generally decreases with increasing hydrogen flow rate. Generally, the extinction coefficient varies approximately exponentially with hydrogen flow rate. In particular, the extinction coefficient of the hydrogenated silicon layer produced at a hydrogen flow rate of 80 sccm is less than 0.0004 over the wavelength range of 800 nm to 1120 nm.

As indicated above, FIGS. 8A-8B are provided merely as one or more example. Other examples may differ from what is described with regard to FIGS. 8A-8B.

Figure 9:
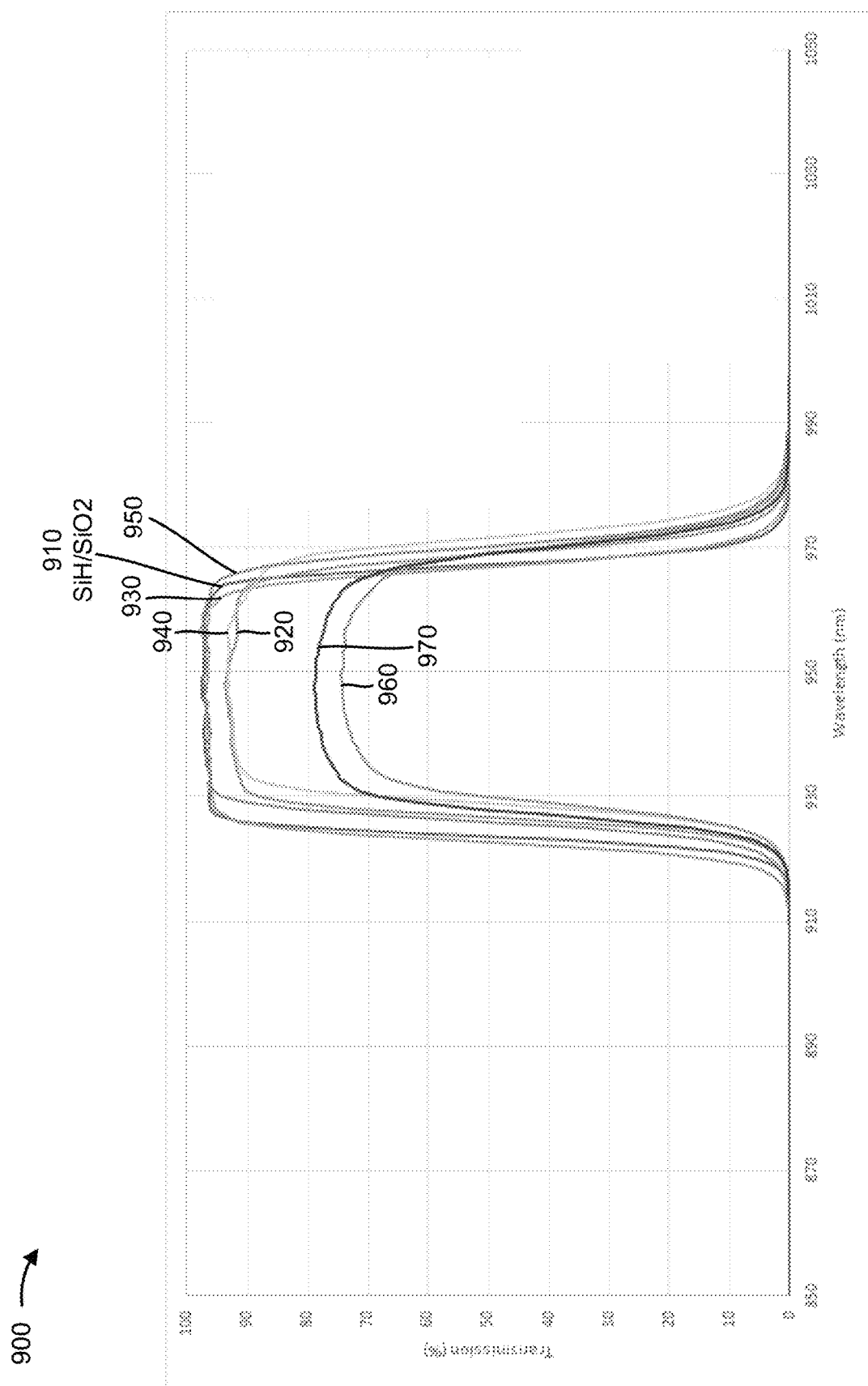
FIG. 9 is a plot of an example of transmission spectra for optical filters described herein.

FIG. 9 is a plot of an example 900 of transmission spectra for optical filters described herein. For example, FIG. 9 illustrates transmission spectra of various example three-material stacks compared to the transmission spectra of an example two material stack of alternating $SiO_2$ and Si:H, which is shown by reference number 910. To manufacture a three-material stack corresponding to reference number 920, the layers may be deposited as illustrated by FIG. 1A. For example, O layers 135 may be deposited as a 3 nm layer of $SiO_2$, the H layers 130 may be deposited as Si:H layers, the L layers 140 may be deposited as $Ta_2O_5$ layers, and an $SiO_2$ layer may be deposited before each Si:H layer. As described above, however, a depth analysis of the example stack corresponding to reference number 120 may include a filter option that includes SiOH and/or $SiO_x$, where 0<x<2. The layers may not appear as three distinct layers but as a transition from Si:H to $Ta_2O_5$.

To manufacture a three-material stack corresponding to reference number 930, the layers may be deposited as illustrated by FIG. 1B. In this case, the O layers 135 and the P layers 145 may be deposited as a 3 nm layer of $SiO_2$, the H layers 130 may be deposited as Si:H layers, the L layers may deposited as $Ta_2O_5$ layers, whereby an $SiO_2$ layer may be deposited before and after each Si:H layer. As described above, however, a depth analysis of the example stack corresponding to reference number 930 may include a filter option that includes SiOH and/or $SiO_x$, where 0<x<2. Examples include substrate —Si:H—$SiO_2$—$Ta_2O_5$—$SiO_2$—Si:H—$SiO_2$—$Ta_2O_5$—$SiO_2$; substrate —Si:H—$SiO_x$—$Ta_2O_5$—$SiO_x$—Si:H—$SiO_x$—$Ta_2O_5$; substrate —SiOH—$SiO_x$—$Ta_2O_5$—$SiO_x$—SiOH—$SiO_x$—$Ta_2O_5$, or a combination thereof, where x may not be equal for every O layer 135 and/or P layer 145 and 0<x<2 (e.g., $SiO_{1.3}$ $SiO_{1.7}$, Si, and/or the like). The layers may not appear as four distinct layers but as a transition from Si:H to $Ta_2O_5$.

To manufacture a three-material stack corresponding to reference number 940, the layers may be deposited as illustrated by FIG. 1A. For example, O layers 135 may be deposited as a 6 nm layer of $SiO_2$, the H layers 130 may be deposited as Si:H layers, the L layers 140 may be deposited as $Ta_2O_5$ layers, and an $SiO_2$ layer may be deposited before each Si:H layer. As described above, however, a depth analysis of the example stack corresponding to reference number 940 may include a filter option that includes SiOH and/or SiO$_x$, where 0<x<2. The layers may not appear as three distinct layers but as a transition from Si:H to Ta$_2$O$_5$.

To manufacture a three-material stack corresponding to reference number 950, the layers may be deposited as illustrated by FIG. 1B. In this case, the O layers 135 and the P layers 145 may be deposited as a 6 nm layer of SiO$_2$, the H layers 130 may be deposited as Si:H layers, the L layers 140 may deposited as Ta$_2$O$_5$ layers, whereby an SiO$_2$ layer may be deposited before and after each Si:H layer. As described above, however, a depth analysis of the example stack corresponding to reference number 950 may include a filter option that includes SiOH and/or SiO$_x$, where 0<x<2. Examples include substrate —Si:H—SiO$_2$—Ta$_2$O$_5$—SiO$_2$—Si:H—SiO$_2$—Ta$_2$O$_5$—SiO$_2$; substrate —Si:H—SiO$_x$—Ta$_2$O$_5$—SiO$_x$—Si:H—SiO$_x$—Ta$_2$O$_5$; substrate —SiOH—SiO$_x$—Ta$_2$O$_5$—SiO$_x$—SiOH—SiO$_x$—Ta$_2$O$_5$, or a combination thereof, where x may not be equal for every O layer 135 and/or P layer 145 and 0<x<2 (e.g., SiO$_{1.3}$, SiO$_{1.7}$, Si, and/or the like). The layers may not appear as four distinct layers but as a transition from Si:H to Ta$_2$O$_5$.

To manufacture a three-material stack corresponding to reference number 960, the layers of Si:H and Ta$_2$O$_5$ may be deposited in alternation (e.g., without any SiO$_2$ layers). As described above, however, a depth analysis of the example stack corresponding to reference number 960 may include a filter option that includes SiOH and/or Ta$_2$O$_Y$, where 0<Y<5. The layers may not appear as two distinct layers but as a transition from Si:H to Ta$_2$O$_5$.

To manufacture a three-material stack corresponding to reference number 970, the layers may be deposited as illustrated by FIG. 1C. For example, the O layers 135 may be deposited as a 3 nm layer of SiO$_2$, the H layers 130 may be deposited as Si:H layers, the L layers 140 may be deposited as Ta$_2$O$_5$ layers, and an SiO$_2$ layer may be deposited after each Si:H layer. As described above, however, a depth analysis of the example stack corresponding to reference number 970 may include a filter option that includes SiOH and/or SiO$_x$, where 0<x<2. The layers may not appear as three distinct layers but as a transition from Si:H to Ta$_2$O$_5$. Examples include substrate —Si:H—Ta$_2$O$_5$—SiO$_2$—Si:H—Ta$_2$O$_5$—SiO$_2$; substrate —Si:H—Ta$_2$O$_5$—SiO$_x$—Si:H—Ta$_2$O$_Y$; substrate —SiOH—Ta$_2$O$_5$—SiO$_x$—SiOH—Ta$_2$O$_Y$, or a combination thereof, where x may not be equal for every O layer 435 and 0<x<2 (e.g., SiO$_{1.3}$, SiO$_{1.7}$, Si, and/or the like) and Y may not be equal for every L layer 140 and 0<Y<5.

In the various examples provided above, in cases where a structure includes layers arranged as Si:H—SiO$_2$—Ta$_2$O$_5$—SiO$_2$—Si:H and/or the like, SiO$_x$ may be used as a transition material at an interface between an Si:H layer and an SiO$_2$ layer, such as from an Si:H layer to an SiO$_2$ layer, from an SiO$_2$ layer to an Si:H layer, and/or the like. Furthermore, in cases where a structure includes layers arranged as Si:H—SiO$_2$—Ta$_2$O$_5$ and/or the like with SiO$_x$ used as a transition material at one or more interfaces between an Si:H layer and an SiO$_2$ layer, a top SiO$_x$ portion may less than fully oxidized, and only oxidized by an amount that is sufficient to prevent the silicon-based layer(s) from taking an oxygen from the Ta$_2$O$_5$ layer(s). Furthermore, as described above, in cases where a structure includes layers arranged as Si:H—Ta$_2$O$_5$—Si:H and/or the like, there may be one or more transition materials from Si:H to Ta$_2$O$_5$, one or more transition materials from Ta$_2$O$_5$ to Si:H, and/or the like.

As indicated above, FIG. 9 is provided merely as one or more examples. Other examples may differ from what is described with regard to FIG. 9.

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, and/or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," and/or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An optical filter, comprising:
   a set of optical filter layers,
   the set of optical filter layers including:
      a first subset of optical filter layers comprising a first material with a first refractive index,
         the first material comprising at least silicon and hydrogen, and
         the first refractive index being at or greater than 3.6 at a particular wavelength;
      a second subset of optical filter layers comprising a second material with a second refractive index,
         the second material being different from the first material and the second refractive index being less than the first refractive index, and
         the second material including a tantalum pentoxide (Ta$_2$O$_5$) material; and
      a third subset of optical filter layers comprising a third material different from the first material and the second material, a first layer of the third subset of optical filter layers being deposited on and adjacent to a layer of the second subset of optical filter layers, and
the layer of the second subset of optical filter layers being deposited on and adjacent to a second layer of the third subset of optical filter layers.

2. The optical filter of claim 1, where the first material includes at least one of:
a hydrogenated silicon (Si:H) material,
a silicon-germanium (SiGe) material, or
a hydrogenated silicon-germanium (SiGe:H) material.

3. The optical filter of claim 1, further comprising:
a fourth subset of optical filter layers,
the fourth subset of optical filter layers comprising a fourth material different from at least the first material and the second material.

4. The optical filter of claim 1, further comprising:
a substrate onto which the set of optical filter layers are disposed.

5. The optical filter of claim 4, where the set of optical filter layers is disposed onto a first side of the substrate, and where a coating is disposed onto a second side of the substrate.

6. The optical filter of claim 1, where the optical filter is a bandpass filter.

7. The optical filter of claim 1, where the optical filter is annealed.

8. The optical filter of claim 1, wherein the first refractive index is greater than 3.64 at the particular wavelength.

9. The optical filter of claim 1,
wherein the first material includes a hydrogenated silicon (Si:H) material,
wherein the first refractive index is at or greater than 3.8 at the particular wavelength, and
wherein the particular wavelength is a wavelength of approximately 800 nm or 830 nm.

10. The optical filter of claim 1, wherein the first subset of optical filter layers further comprises one or more of phosphorous, boron, or carbide.

11. The optical filter of claim 1,
wherein the first material includes a hydrogenated silicon (Si:H) material or a hydrogenated silicon-germanium (SiGe:H) material,
wherein the first refractive index is greater than 3.7 at the particular wavelength, and
wherein the particular wavelength is a wavelength of approximately 950 nm.

12. The optical filter of claim 1, wherein the particular wavelength is a wavelength of approximately 800 nm or 830 nm.

13. An optical system, comprising:
an optical transmitter to emit near-infrared (NIR) light;
an optical filter to filter an input optical signal and provide a filtered input optical signal,
the input optical signal including the NIR light from the optical transmitter and ambient light from an optical source,
the optical filter including a set of dielectric thin film layers,
the set of dielectric thin film layers including:
a first subset of layers formed from a first material having a first refractive index,
a second subset of layers formed from a second material having a second refractive index less than the first refractive index,
the second material including at least one of a tantalum pentoxide ($Ta_2O_5$) material, a magnesium fluoride ($MgF_2$) material, a zirconium oxide ($ZrO_2$) material, or a yttrium oxide ($Y_2O_3$) material,
a third subset of layers formed from a third material different from the first material and the second material, and
a fourth subset of layers formed from a fourth material different from the first material, the second material, and the third material;
the first refractive index being at or greater than 3.6 at a particular wavelength,
the filtered input optical signal including a reduced intensity of ambient light relative to the input optical signal,
a first layer of the third subset of optical filter layers being on and adjacent to a layer of the second subset of optical filter layers, and
the layer of the second subset of optical filter layers being on and adjacent to a second layer of the third subset of optical filter layers; and
an optical receiver to receive the filtered input optical signal and provide an output electrical signal.

14. The optical system of claim 13, where the optical filter is associated with greater than 80% transmissivity at approximately 950 nanometers.

15. The optical system of claim 13, where the optical filter is associated with greater than 90% transmissivity at approximately 950 nanometers.

16. The optical system of claim 13, where the optical filter is associated with greater than 80% transmissivity at approximately 1550 nanometers.

17. The optical system of claim 13, where the optical filter is associated with greater than 90% transmissivity at approximately 1550 nanometers.

18. The optical system of claim 13, where the first subset of layers are hydrogenated.

19. The optical system of claim 13, wherein the particular wavelength is a wavelength of approximately 800 nm or 830 nm.

20. A method of making an optical filter comprising:
depositing a first subset of optical filter layers of the optical filter,
the first subset of optical filter layers comprising a first material with a first refractive index, and
the first refractive index being at or greater than 3.6 at a particular wavelength;
depositing a second subset of optical filter layers of the optical filter,
the second subset of optical filter layers comprising a second material with a second refractive index that is less than the first refractive index, and
the second material including at least one of a tantalum pentoxide ($Ta_2O_5$) material, a magnesium fluoride ($MgF_2$) material, a zirconium oxide ($ZrO_2$) material, or a yttrium oxide ($Y_2O_3$) material; and
depositing a third subset of optical filter layers comprising a third material different from the first material and the second material,
a first layer of the third subset of optical filter layers being deposited on and adjacent to a layer of the second subset of optical filter layers, and
the layer of the second subset of optical filter layers being deposited on and adjacent to a second layer of the third subset of optical filter layers.

21. The method of claim 20, where one or more of the first subset of optical filter layers, the second subset of optical filter layers, or the third subset of optical filter layers are deposited via direct current sputtering.

22. The method of claim 20, wherein the particular wavelength is a wavelength of approximately 800 nm or 830 nm.

23. The method of claim 20, wherein the second material includes the $Ta_2O_5$ material.

\* \* \* \* \*